(12) United States Patent
Kurakami et al.

(10) Patent No.: US 7,324,787 B2
(45) Date of Patent: Jan. 29, 2008

(54) METHOD OF RAMPING UP OUTPUT LEVEL OF POWER AMPLIFIER OF RADIO COMMUNICATION SYSTEM, COMMUNICATION SEMICONDUCTOR INTEGRATED CIRCUIT, AND RADIO COMMUNICATION SYSTEM

(75) Inventors: Noriyuki Kurakami, Maebashi (JP); Kazuhiko Hikasa, Hamura (JP); Ryoichi Takano, Takasaki (JP); Patrick Wurm, Royston (GB)

(73) Assignees: Renesas Technology Corporation, Tokyo (JP); TTPCOM Limited, Hertfordshire (GB)

( * ) Notice: Subject to any disclaimer, the term of this patent is extended or adjusted under 35 U.S.C. 154(b) by 271 days.

(21) Appl. No.: 10/901,195

(22) Filed: Jul. 29, 2004

(65) Prior Publication Data
US 2005/0064828 A1 Mar. 24, 2005

(30) Foreign Application Priority Data
Jul. 31, 2003 (GB) .................................. 0318013

(51) Int. Cl.
*H04B 1/00* (2006.01)
(52) U.S. Cl. ................... 455/69; 455/311; 455/522; 455/194.2; 455/127.1; 455/127.2; 455/88; 455/13.4; 375/300; 375/302
(58) Field of Classification Search ............. 455/115.1, 455/127.1, 69, 194.2, 311, 522, 127.2, 88, 455/13.4; 375/300, 302
See application file for complete search history.

(56) References Cited

U.S. PATENT DOCUMENTS

| | | | | |
|---|---|---|---|---|
| 5,430,416 A | * | 7/1995 | Black et al. ................. | 332/145 |
| 5,574,993 A | * | 11/1996 | Kobayashi et al. ......... | 455/126 |
| 5,920,823 A | * | 7/1999 | Murai ......................... | 455/522 |
| 6,018,275 A | * | 1/2000 | Perrett et al. ............... | 332/127 |
| 6,043,707 A | * | 3/2000 | Budnik ........................ | 330/10 |
| 6,215,362 B1 | * | 4/2001 | Feng et al. .................. | 331/17 |
| 6,633,199 B2 | * | 10/2003 | Nielsen et al. .............. | 330/129 |
| 6,801,784 B1 | * | 10/2004 | Rozenblit et al. ........... | 455/522 |
| 6,856,793 B2 | * | 2/2005 | Dunne et al. ............. | 455/115.4 |
| 7,050,772 B2 | * | 5/2006 | Herzberg et al. ........ | 455/191.3 |
| 7,085,544 B2 | * | 8/2006 | Takano et al. .............. | 455/102 |
| 7,099,636 B2 | * | 8/2006 | Rozenblit et al. ........... | 455/126 |
| 7,209,717 B2 | * | 4/2007 | Okada et al. ............... | 455/126 |

(Continued)

OTHER PUBLICATIONS

"High Linearity RF Amplifier Design", P. Kenington et al, p. 162, 1979, Artech House, Inc.

*Primary Examiner*—Lana Le
*Assistant Examiner*—Amar Daglawi
(74) *Attorney, Agent, or Firm*—Mattingly, Stanger, Malur & Brundidge, P.C.

(57) ABSTRACT

In a radio communication system having a phase control loop for phase modulation and an amplitude control loop for amplitude modulation and being capable of time divisional transmission and reception under a predetermined time management, when transmission in a first mode is switched to transmission in a second mode or when transmission in the second mode is switched to transmission in the first mode, the output level of the power amplifier is lowered once to a predetermined level higher than the level when transmission related circuits are activated, and thereafter the output level of the power amplifier is again ramped after the settings have been changed but without starting of a transmission oscillator, establishing of the phase control loop and the amplitude control loop.

5 Claims, 14 Drawing Sheets

U.S. PATENT DOCUMENTS

| | | | |
|---|---|---|---|
| 2002/0127990 A1* | 9/2002 | Bollenbeck | 455/293 |
| 2002/0158621 A1* | 10/2002 | Tao et al. | 324/76.35 |
| 2003/0134654 A1* | 7/2003 | Masuda et al. | 455/522 |
| 2003/0137347 A1* | 7/2003 | Arai et al. | 330/129 |
| 2003/0203720 A1* | 10/2003 | Oosawa et al. | 455/84 |
| 2003/0224740 A1* | 12/2003 | Takano et al. | 455/102 |
| 2003/0224743 A1* | 12/2003 | Okada et al. | 455/127.2 |
| 2003/0228852 A1* | 12/2003 | Murakami et al. | 455/127.3 |
| 2004/0102207 A1* | 5/2004 | Wenzel et al. | 455/522 |
| 2004/0198257 A1* | 10/2004 | Takano et al. | 455/108 |
| 2004/0198270 A1* | 10/2004 | Rozenblit et al. | 455/126 |
| 2004/0229579 A1* | 11/2004 | Tsutsui et al. | 455/127.2 |
| 2004/0229592 A1* | 11/2004 | Matsui et al. | 455/333 |
| 2004/0248528 A1* | 12/2004 | Rozenblit et al. | 455/126 |
| 2005/0042994 A1* | 2/2005 | Otaka et al. | 455/180.3 |
| 2005/0107056 A1* | 5/2005 | Okasaka et al. | 455/251.1 |
| 2005/0176388 A1* | 8/2005 | Yamawaki et al. | 455/126 |
| 2006/0189285 A1* | 8/2006 | Takano et al. | 455/127.2 |

* cited by examiner

GMSK-Direct→EDGE

GMSK-TypeI→EDGE

GMSK-Direct→GMSK-TypeI

GMSK-TypeI→GMSK-Direct

EDGE→GMSK-TypeI

EDGE→GMSK-Direct

FIG. 15A Frame
| #0 | #1 | #2 | #3 | #4 | #5 | #6 | #7 |
Slot
FIG. 15B Mode
| Tx | Tx | Tx | Tx | | Mon | | Rx |
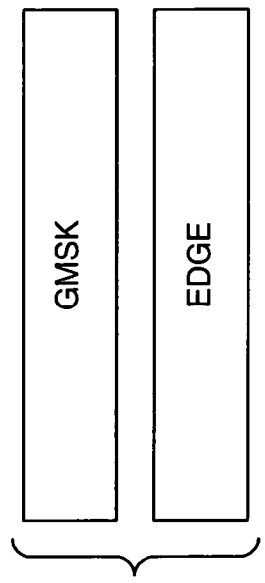
FIG. 15C EXAMPLE OF EGPRS TRANSMISSION WITH NO TRANSITION BETWEEN GMSK AND EDGE BURSTS
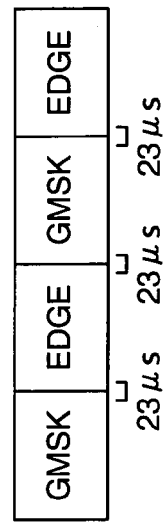
FIG. 15D ANOTHER EXAMPLE OF EGPRS TRANSMISSION INVOLVING TRANSITION BETWEEN GMSK AND EDGE BURSTS

METHOD OF RAMPING UP OUTPUT LEVEL OF POWER AMPLIFIER OF RADIO COMMUNICATION SYSTEM, COMMUNICATION SEMICONDUCTOR INTEGRATED CIRCUIT, AND RADIO COMMUNICATION SYSTEM

CROSS-REFERENCE TO RELATED APPLICATIONS

The present application relates to subject matters described in co-pending application Ser. No. 10/373,031 filed on Feb. 26, 2003 by the same applicants of the present application. The disclosures of the co-pending application are incorporated herein by reference.

BACKGROUND OF THE INVENTION

The present invention relates to radio communication technology, more particularly to technology effective for application to ramping up a control loop of a radio communication system, and specifically to technology effective for application to a radio communication system such as a portable telephone having a phase control loop for phase modulation and an amplitude control loop for amplitude modulation.

One of conventional schemes for radio communication apparatus (mobile communication apparatus) such as a portable telephone is GSM (Global System for Mobil Communication) which is employed in Europe. This GSM scheme uses a phase modulation mode called GMSK (Gaussian Minimum Shift Keying) which shifts the phase of a carrier in accordance with transmission data.

In recent portable telephones, an EDGE (Enhanced Data Rates for GMS Evolution) scheme has been proposed. The EDGE scheme has dual-mode communication functions, and relies on GMSK modulation to perform audio signal communications and on 3π/8 rotating 8-PSK (Phase Shift Keying) modulation to perform data communications. The 8-PSK modulation is such modulation that adds an extra amplitude shift to a phase shift of a carrier in the GMSK modulation. Since the 8-PSK modulation can send 3-bit information per symbol, in contrast with the GMSK modulation which sends 1-bit information per symbol, the EDGE scheme can achieve communications at a higher transmission rate as compared with the GSM scheme.

As one implementation of a modulation mode for imparting information on a phase component and an amplitude component, respectively, of a transmission signal, there is a conventionally known configuration called "polar loop" which involves separating a signal intended for transmission into a phase component and an amplitude component, subsequently applying feedback to the separated components through a phase control loop and an amplitude control loop, and combining the resulting components by an amplifier for outputting the combined components (for example, "High Linearity RF Amplifier Design" by Kenington, Peter B., p. 162, published by ARTECH HOUSE, INC. in 1979).

SUMMARY OF THE INVENTION

The present inventors have invented a radio communication system of an EDGE scheme adopting a polar loop scheme which is disclosed in U.S. patent application Ser. No. 10/373,031 filed on Feb. 26, 2003. In the polar scheme developed by the present inventors, the phase control loop feeds back a signal to a phase comparator which compares an output of a transmission oscillator or a high frequency power amplification circuit (hereinafter called a power amplifier) with a reference signal, and the amplitude control loop feeds back a signal to an amplitude comparator which compares an output signal of the power amplifier with a reference signal.

As shown in FIG. 15A, the transmission/reception operation of a GSM communication system is managed by a frame comprising eight slots (one slot is 577 μsec). Each slot is assigned one of a transmission mode Tx, a reception mode Rx and a monitor mode Mon for detecting a distance to a base station. The operation in the monitor mode Mon is a reception operation.

In the standard (GRPS Class 12) related to data transfer in the GSM standard, transmission is assigned to four slots among the eight slots of one frame, and the format of a frame with one slot assigned to reception is defined as shown in FIG. 15B. An empty slot is assigned an idle mode in which only some circuits operate such as in a standby state and most of circuits at least including an oscillation circuit stops their operations.

The GPRS standard also defines EGPRS modes in which transmission is performed always with a GMSK modulation scheme or always with the EDGE modulation scheme using four consecutive slots #0 to #3 as shown in FIG. 15C and an EGPES mode in which transmission is performed with both GMSK and EDGE modulation schemes using four consecutive slots #0 to #3 as shown in FIG. 15D.

In order to perform continuous transmission in the EGPRS mode, when a next slot is transmitted after one slot is transmitted, the output level of the power amplifier is required to be in a predetermined time mask, as defined in the GSM standard. It is therefore necessary to once lower the output of the power amplifier to a predetermined level or smaller and then ramp up the power level, when the transmission is to be switched. Specifically, when transmission is switched from the GMSK mode to the EDGE mode, the output level is required to be once lowered from for example +33 dBm near to 0 dBm and then ramped up to for example +27 dBm, while when the transmission is switched from the EDGE mode to GMSK mode, the output level is required to be once lowered from for example +27 dBm near to 0 dBm and then ramped up to for example +33 dBm. The GSM standard also defines that switching the slot is completed in a short time such as 23 μsec.

If the output of the power amplifier is lowered and ramped up rapidly in order to speed up switching a transmission slot, the switching time can be easily shortened within the prescribed time. However, such rapid lowering and ramping up of the output of the power amplifier degrades the frequency spectrum and may adversely affect nearby channels. If the output of the power amplifier is gradually lowered and ramped up, the slot cannot be switched within the prescribed time.

In the radio communication system of the polar loop system disclosed in the co-pending U.S. patent application Ser. No. 10/373,031 and developed by the present inventors, the GMSK mode utilizes only the phase control via the sub whereas the EDGE mode utilizes both the phase control main loop and amplitude control main loop, so that it is necessary to newly set up the amplitude control loop when the transmission slot is changed from the GMSK mode to the EDGE mode. When the transmission mode is switched from the EDGE mode to the GMSK mode, although the amplitude control loop is unnecessary in GMSK mode, the settings of the control loops are required to be changed such as switching between loop filters for limiting the frequency bandwidth of the phase loops, because the frequency bandwidth of the phase loop is different between the GMSK and EDGE modes.

The radio communication system of the polar loop system disclosed in the aforementioned co-pending U.S. patent application and developed by the present inventors provides two GMSK modes: a normal GMSK mode (in this specification, this mode is called hereinafter GMSK-Direct) in which the power amplifier is directly controlled by a control voltage VRAMP from the baseband LSI; and a mode (in this specification, this mode is called hereinafter GMSK-Type I) in which the power amplifier is indirectly controlled by controlling the gain of an amplifier in the high frequency IC by using the control voltage VRAMP.

Switching patterns even between the transmission modes include a pattern from the normal GMSK mode (GMSK-Direct) to the EDGE mode and a pattern from the EDGE mode to the GMSK mode (GMSK-Direct), and in addition there are four switching patterns: a pattern from the GMSK-Type I to the EDGE mode; a pattern from the EDGE mode to the GMSK-Type I; a pattern from the GMSK-Type I to the GMSK-Direct; and a pattern from the GMSK-Direct to the GMSK-Type I. Namely, there are six switching patterns in total as shown in FIGS. 14A-14F.

In configuring a system of the GSM standard, slot switching is required to finish within 23 μsec prescribed in the standard for all of these switching patterns. If the ramp-up sequence of the control loop upon turning on the power can be utilized for such slot switching, it is not necessary to provide a new switching sequence and the system design becomes easy. However, in the radio communication system adopting the polar loop system and applied previously, when the output of the power amplifier is lowered to 0 dBm and the phase loop is switched from EDGE to GSMK mode, the amplitude loop would create a transient that is not acceptable.

The present invention has been made by paying attention to such an issue. An object of the present invention is to provide a control method for a radio communication system having a phase control loop for phase modulation and an amplitude control loop for amplitude modulation and being capable of time divisional transmission and reception under a predetermined time management, wherein lowering and ramping up the output level of a power amplifier can be completed within a predetermined time for switching between transmission modes and the transients associated with the switching are kept at a low level.

Another object of the present invention is to provide a communication semiconductor integrated circuit for a radio communication system having a phase control loop for phase modulation and an amplitude control loop for amplitude modulation and being capable of time divisional transmission and reception under a predetermined time management, wherein lowering and ramping up the output level of a power amplifier can be automatically executed and completed within a predetermined time for switching between transmission modes upon reception of a predetermined command.

Still another object of the present invention is to provide a communication semiconductor integrated circuit having a phase detection circuit for phase modulation and an amplitude detection circuit for amplitude modulation, being capable of continuous transmission in a plurality of modes having different modulation methods by using common feedback control loops, and being capable of completing lowering and ramping up the output level of a power amplifier within a predetermined time for switching between transmission modes.

The summary of the typical invention disclosed in the application will be described briefly in the following.

In the radio communication system having a phase control loop for controlling the phase of a carrier output from a transmission oscillator and an amplitude control loop for controlling the amplitude of a transmission signal output from a power amplification circuit and being capable of transmission in a GMSK modulation mode and in a 8-PSK modulation mode, when the output level of a power amplifier is ramped up for the activation of transmission by 8-PSK modulation utilizing both the phase control loop and amplitude control loop, activation of the transmission oscillator, establishment of the phase control loop including a phase detection circuit, establishment of the amplitude control loop including an amplification detection circuit, ramp-up of the output level of the power amplifier are sequentially performed in this order. When transmission by GMSK modulation is switched to transmission by 8-PSK modulation or vice versa, the output level of the power amplifier is once lowered to a predetermined level higher than the level when the transmission is activated, and then the output level of the power amplifier is again ramped up without performing activation of the transmission oscillator, establishment of the phase control loop and establishment of the amplitude control loop.

In this manner, when the transmission mode is changed to a transmission mode having a different modulation method, lowering and ramping up the output level of the power amplifier can be completed within the predetermined time prescribed by the GSM standard. Activation of transmission is intended to mean activation when the power is turned on, and activation when the sleep state stopping the transmission oscillator such as an idle mode is subjected to transition to a transmission mode.

Other objects, features and advantages of the invention will become apparent from the following description of the embodiments of the invention taken in conjunction with the accompanying drawings.

BRIEF DESCRIPTION OF THE DRAWINGS

FIGS. 15A, 15B, 15C, and 15D are explanatory diagrams showing the configuration of a frame prescribed in the GSM standard and an example of the format of a frame for data transmission.

DESCRIPTION OF THE EMBODIMENTS

Figure 1:
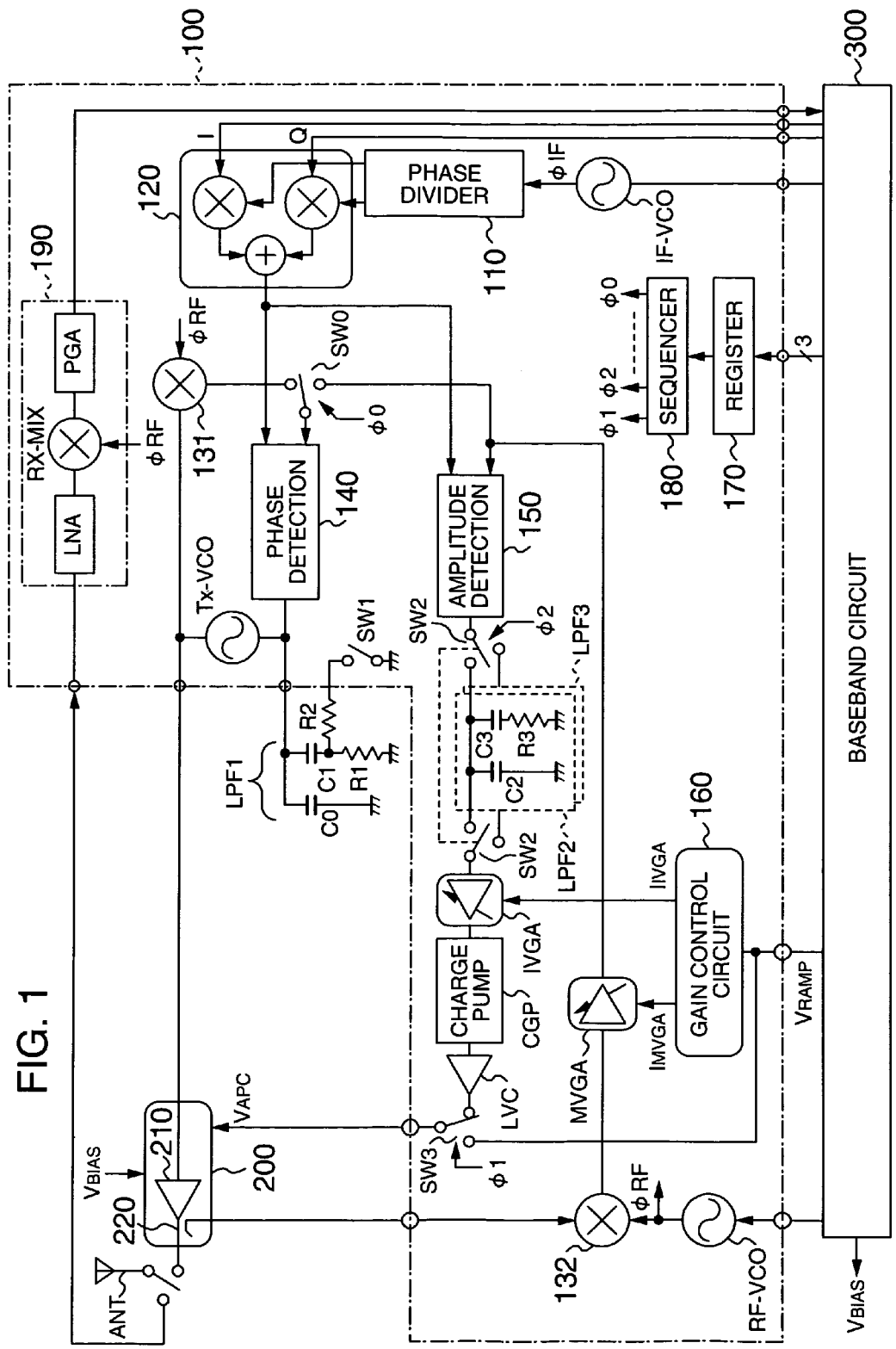
FIG. 1 is a block diagram illustrating the general configuration of a polar loop based transmitter circuit according to one embodiment of the present invention, and an exemplary configuration of a radio communication system using the same.

FIG. 1 illustrates the general configuration of a polar loop based radio communications system according to an embodiment of the present invention.

The radio communications system shown in FIG. 1 a high frequency IC (integrated circuit) 100 which is capable of performing the GMSK modulation in a GSM system, and the 8-PSK modulation in an EDGE system; a power module 200 which includes a high frequency power amplifier (high frequency power amplification circuit) 210 for driving an antenna ANT for transmission, a coupler 220 for detecting transmission power, and the like; a baseband circuit 300 for generating I/Q signals based on transmission data (baseband signal), and generating a control signal for the high frequency IC 100 and a bias voltage VBIAS for the power amplifier 210 in the power module 200; and the like. The baseband circuit 300 can be implemented as a semi-conductor large scale integrated circuit (hereinafter called a baseband LSI) on one semiconductor chip.

In this embodiment, the high frequency IC 100 is formed: with transmission-related circuits comprising a modulation circuit 120, an oscillator for transmission TxVCO for generating a phase modulated transmission signal (carrier) and the like; and with a reception-related circuit 190 comprising a low noise amplifier (LNA) for amplifying a reception signal, a mixer (Rx_MIX) for mixing a reception signal and an oscillation signal from a high frequency oscillator RF-VCO and downconverting the reception signal to demodulate a baseband signal, a programmable high gain amplifier (PGA) for amplifying the demodulated signal and the like.

The radio communications system of the embodiment comprises two control loops, i.e., a feedback control loop for a phase control (in this specification, this is called a phase control loop or a subsidiary phase control loop) and a feedback control loop for an amplitude control (in this specification, this is called an amplitude control loop.

The high frequency IC 100 comprises: a phase divider circuit 110 for generating intermediate frequency signals at 80 MHz having a phase shift of 90° by dividing an oscillation signal φIF at a frequency of 640 MHz generated by an oscillator IF-VCO; a quadrature modulation circuit 120 for mixing I/Q signals supplied from the baseband LSI 300 with the signals divided by the phase divider circuit 110 for quadrature modulation; a mixer 131 for mixing a feedback signal from the oscillator for transmission TxVCO with an oscillating signal φRF for downconversion to a signal at 80 MHz; a phase detection circuit 140 for detecting a difference in phase between an output signal of the mixer 131 and an output signal of the quadrature modulation circuit 120; a mixer 132 for mixing a detection signal from the coupler 220 for detecting an output level of the power simplifier 210 with the oscillating signal φRF from a high frequency oscillator RF-VCO; a feedback variable gain amplification circuit MVGA for amplifying an output of the mixer 132; an amplitude detection circuit 150 for comparing the amplified signal with the output signal of the quadrature modulation circuit 120 to detect an amplitude difference; a loop filter LPF2 for generating a voltage under the control of the amplitude detection circuit 150 and for limiting a frequency bandwidth of an amplitude control loop; a forward variable gain amplification circuit IVGA for amplifying an output of the loop filter LPF2; a gain control circuit 160 for controlling the gains of the variable; a charge pump circuit CGP; a level shift circuit LVS; a gain control circuit 160 for controlling the gains of variable gain amplification circuits MVGA and IVGA; a register 170 for setting control information, operation mode and the like in the chip; a control circuit 180 for controlling each circuit in the chip in accordance with the set values in the register 170; and the like.

The control circuit 180 has a sequencer function of generating a timing signal for each of the circuits in the chip to operate the circuit in a predetermined order in accordance with an input command from the baseband LSI 300 and a designated operation mode.

The amplitude control loop is formed by the coupler 220-loop filter 132-variable gain amplification circuit MVGA-amplitude detection circuit 150-loop filter LPF2-variable gain amplification circuit IVGA-power amplifier 210. The phase control loop is formed by the phase detection circuit 140-loop filter LPF1-oscillator for transmission TxVCO-mixer 131-phase detection circuit 140. In this embodiment, the loop filter LPF1 is composed of external capacitors C0 and C1 and a resistor R1 connected in series with C1.

In the high frequency IC 100 of this embodiment, if there is a phase difference between an output signal of the quadrature modulation circuit 120 and a feedback signal from the mixer 131, a voltage for reducing the phase difference is supplied to a frequency control terminal of the oscillator for transmission TxVCO, such that the phase of the feedback signal from the mixer 131 matches with the phase of the output signal of the quadrature modulation circuit 120. This phase control loop performs such a control that prevents the phase of the output of the oscillator for transmission TxVCO from shifting due to fluctuations in power supply voltage and a change in temperature. The oscillator for transmission TxVCO has a constant amplitude.

In the high frequency IC 100 of the embodiment, an output of the variable gain amplification circuit MVGA is supplied to both the phase detection circuit 140 and amplitude detection circuit 150, and a switch SW0 is provided such that a path formed by the coupler 220-mixer 132-variable gain amplitude circuit MVGA can be used as a feedback path common to the amplitude and phase control loops. The switch SW0 is switched by the control circuit 180 in accordance with a setting state of the register 170 set by the baseband LSI 300.

In an EDGE mode, since an output of the power amplifier 210 contains both a phase modulation component and an amplitude modulation component, either an output of the oscillator for transmission TxVCO or an output of the power amplifier 210 may be used as a feedback signal SFB to the phase detection circuit 140 which has an output phase component. However, since an output of the power amplifier 210 is very low when the power amplifier 210 is powered on, the phase control loop cannot be immediately locked by a feedback signal coming from the amplitude control loop.

In the EDGE mode, the feedback path of the amplitude control loop is indispensable for correcting distortion generated in the power amplifier. After the loop is locked, the feedback path may be used in common by both the amplitude and phase control loops and the phase control loop on the side of TxVCO including the mixer 131 can be deactivated. In this manner, a power consumption can be reduced and a highly accurate phase modulation is obtained at the output of the power amplifier.

Thus, in this embodiment, when the output power is raised up, the switch SW0 is switched to select a feedback signal from the phase control loop, i.e., from the mixer 131, and when the loop is stabilized, the switch SW0 is switched to select a signal from the feedback path, i.e., from the variable gain amplification circuit MVGA (in this specification, this loop is called a main phase control loop to distinguish from the subsidiary phase control loop). In this manner, after the loop is stabilized, the phase of an output of the power amplifier 210 is controlled to coincide with the phase of a signal SREF from the modulation circuit 120 so that a phase control more precise than the control by the subsidiary phase control loop can be performed.

The loop filter LPF1 on the subsidiary phase control loop is composed of capacitors C0 and C1 and a resistor R1 connected in series with C1. The values for the respective capacitors and resistor are determined such that the frequency bandwidth of the loop filter LPF1 is defined in a 1.2 MHz frequency bandwidth for reducing the noise at large frequency offsets in consideration of an GMSK modulation mode which performs only phase modulation.

Further, in this embodiment, the subsidiary phase control loop is used by the GMSK modulation mode during all the burst and by the 8-PSK modulation mode only during the acquisition period preceding the burst. More specifically, a serial circuit of a switch SW1 and a resistor R2 is connected in parallel to the resistor R1 of the loop filter LPF1. In EDGE mode, as the switch SW1 is turned on, the resistor R2 is connected in parallel with the resistor R1 so that the frequency bandwidth of the loop filter LPF1 is broadened to 1.8 MHz. Namely, in the 8-PSK modulation mode, the frequency bandwidth of the loop filter LPF1 is set to 1.8 MHz same as that of the amplitude control loop so that the operation can be optimized. In the GMSK modulation mode, the switch SW1 is turned off so that the frequency bandwidth of the loop filter LPF1 is set to 1.2 MHz helping to reduce the noise at large frequency offsets.

In the transmission-related circuits of the high frequency IC 100 of the embodiment, in operation of the 8-PSK modulation mode in the amplitude control loop after the loop is stabilized, an output power of the power amplifier 210 is detected with the coupler 220. This detection signal is mixed by the mixer 132 with an oscillation signal φRF from the high frequency oscillator RF-VCO to be converted into an intermediate frequency (IF) signal. The IF signal is amplified by the variable gain amplification circuit MVGA and supplied to the amplitude detection circuit 150 as a feedback signal SFB.

The amplitude detection circuit 150 compares the feedback signal SFB with a signal SREF modulated by the quadrature modulation circuit 120 to detect an amplitude difference. This amplitude difference is supplied via the loop filter LPF2 to the variable gain amplification circuit IVGA and amplified to be applied to an output control terminal of the power amplifier 210 as a control voltage VAPC for performing an amplitude control.

The loop filter LPF2 on the amplitude loop should have a low open-loop frequency bandwidth from a viewpoint of loop stability and noise reduction, whereas it should have a wide loop bandwidth for improving the accuracy of amplitude modulation (EVM) to provide good spectrum regrowth.

From the foregoing aspect, this embodiment employs a higher-order loop filter as a loop filter LPF2 which is composed of capacitors C4, C2 and C3 and a resistor R3 connected in series with C3. These elements can be calculated to set the open loop frequency band of the amplitude loop to about 1.8 MHz. While the amplitude loop including the higher-order loop filter LPF2 is required for EDGE signals, it is not required when a GMSK signal is used.

In GMSK mode, it is more convenient to use a lower-order filter LPF3 comprised of only one resistor so that the amplitude loop is reduced to the first order. The embodiment also comprises a switch SW2 on both ends of the loop filters LPF2 and LPF3, such that the switch SW2 is switched to the filter LPF2 when a highly accurate amplitude control is required (EDGE Mode). The switch SW2 is switched to the filter LPF3 to provide a larger phase margin and the high stability of the loop when no highly accurate amplitude control is required (GMSK mode). The switch SW2 is switched by a control signal φ2 from the sequencer 180. On the forward path of the embodiment, a capacitor C4 (refer to FIG. 2) is provided after the charge pump circuit CGP. Since the lower-order filter can be formed by using this capacitor C4, the filter LPF3 may be simply a load element such as a resistor element.

In this embodiment, the charge pump CGP and level shift circuit LVC are provided at the succeeding stage of the variable gain amplification circuit IVGA. The charge pump CGP receives a differential output of the variable gain amplification circuit IVGA to charge up or discharge the capacitor CA integrates the output current of the variable gain amplification circuit IVGA. The level shift circuit LVC shifts voltage generated by the charge pump by about 0.6 V to the negative side. The level shift circuit LVC is provided because the charge pump CGP of the embodiment cannot operate at 0 V due to its internal current source, whereas the voltage range of the VAPAC control signal is specified between 0 V and 1.8 V.

In this embodiment, the power amplifier 210 is made of FET and the like. A voltage control circuit (not shown) in the power module 200 generates a drive voltage Vdd corresponding to the control voltage VAPC and applies it to the drain terminal of FET. A proper bias VBIAS generated by the baseband LSI 300 or an unrepresented bias circuit is applied to the gate terminal of the power FET.

In this embodiment, a switch SW3 is provided so that in the GMSK transmission mode, an output level control voltage VRAMP output from the baseband LSI 300 is directly supplied to the power module 200 as VAPC to control an output level of the power amplifier 210. This switch SW3 is switched by a control signal φ1 generated by the control circuit 180 based upon a command code or the like supplied from the baseband LSI 300 to the high frequency IC 100.

In this specification, the mode that the switch SW3 directly supplies the output level control voltage VRAMP to the power module 200 as VAPC, is called GMSK-Direct. In the system of this embodiment, in the GMSK transmission mode it is possible to control an output level of the power amplifier 210 by using the amplitude control loop including the variable gain amplification circuits IVGA and MVGA. This mode is called GMSK-Type I.

Description will be given on the gain control for the variable gain amplification circuit IVGA on the forward path and for the variable gain amplification circuit MVGA on the feedback path.

A portable telephone terminal which supports EDGE or GSM controls a power amplifier to increase or reduce the output power POUT to a desired value within a fixed time at the start and end of transmission. In the system of this embodiment adopting a polar loop, this power control is performed to control the gain of the variable gain amplification circuit MVGA in the EDGE mode and GMSK-Type I mode. Specifically, a reduction in the gain of the variable gain amplification circuit MVGA results in a smaller feedback signal SFB to the amplitude detection circuit 150. The amplitude control loop increases an RF gain GPA (POUT/PIN) of the power amplifier 210 to increase its output power and make the feedback signal SFB rise to the level defined by a reference signal SREF supplied from the modulation circuit.

As the gain of the variable gain amplification circuit MVGA lowers, the output power POUT increases. As the gain of the variable gain amplification circuit MVGA increases, the output power POUT lowers. Therefore, if the output POUT of the power amplifier 210 is desired to be increased, the gain of the variable gain amplification circuit MVGA is lowered, whereas if the output POUT of the power amplifier 210 is desired to be reduced, the gain of the variable gain amplification circuit MVGA is increased.

In this embodiment, the gain of the variable gain amplification circuit MVGA is controlled by the control voltage VRAMP from the baseband LSI 300. In addition, in order to stabilize the amplitude control loop, an increase or reduction rate of the gain GMVGA of the variable gain amplification circuit MVGA is set always equal to the reduction or increase rate of the gain GIVGA of the variable gain amplification circuit IVGA.

The reference signal SREF supplied from the quadrature modulation circuit 120 to the phase detection circuit 140 and amplitude detection circuit 150 is a signal modulated by 8-PSK in the EDGE mode and having changed amplitude and phase components. However, the amplitude control loop controls so that a change in the amplitude component of the output power POUT of the power amplifier becomes coincident with a change in the amplitude component of the reference signal SREF. As a result, an output of the power simplifier is an output subjected to the modulation very analogous to the intrinsic modulation of an 8-PSK modulation signal generated by the quadrature modulation circuit 120. In this case, the output power POUT of the power amplifier 210 takes a desired value by the above-described power control.

Figure 2:
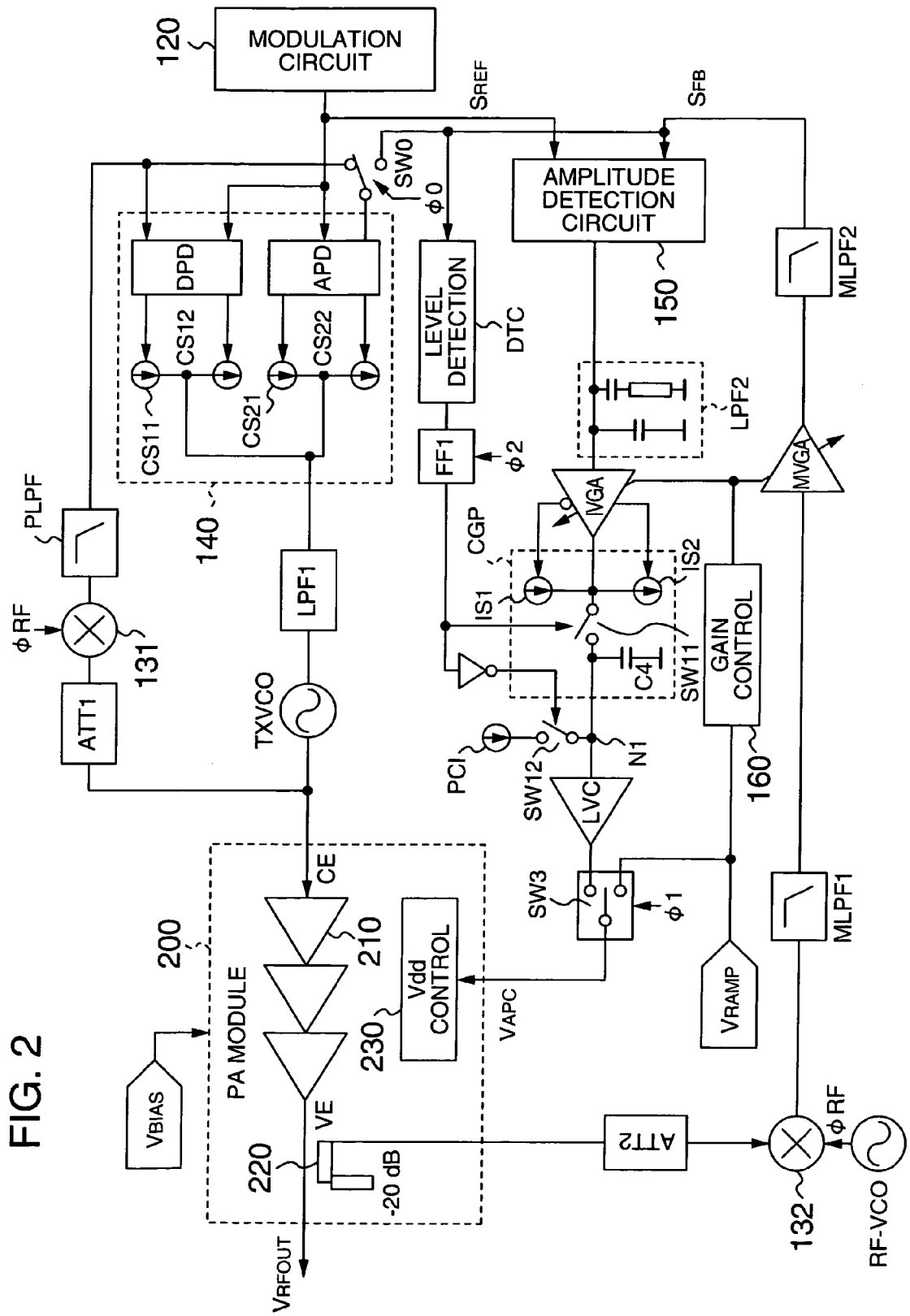
FIG. 2 is a block diagram illustrating an exemplary configuration of a polar loop in the transmitter circuit of FIG. 1 providing a better solution for managing EGPRS transmission.

FIG. 2 illustrates in greater detail an exemplary configuration of a transmitter circuit which applies the polar loop configuration. As illustrated in FIG. 2, the phase detection circuit 140 of this embodiment comprises: a digital phase comparator DPD; an analog phase comparator APD; a pair of constant current sources CS11 and CS12 controlled by a differential output of the digital phase comparator DPD; and a pair of constant current sources CS21 and CS22 controlled by a differential output of the analog phase comparator APD. As will be later described, upon starting transmission, the digital phase comparator DPD first performs a phase comparison, and then is switched to the analog phase comparator APD, so that the phase loop can be rapidly locked.

The current sources CS11 and CS12 controlled by the digital phase comparator DPD generate currents of opposite direction, while the current sources CS21 and CS22 controlled by the analog phase comparator APD also generate currents of opposite direction. As the loop filter LPF1 is successively shared by the digital phase comparator DPD and analog phase comparator APD, the maximum currents of the current sources CS11 and CS12 controlled by the digital phase comparator DPD are preferably set approximately four times larger than the currents of the current sources CS21 and CS22 controlled by the analog phase comparator APD.

Charges pumps are formed by the current sources CS11 and CS12 charging or discharging the capacitors C0 and C1 of the loop filter LPF1, and by the current sources CS21 and CS22 charging or discharging the capacitors C0 and C1 of the loop filter LPF1, respectively. In the digital phase comparator DPD or analog phase comparator APD, a voltage in accordance with a difference in phase between a modulation signal SREF modulated by the modulation circuit 120 and the feedback signal φFB is charged on the capacitors C0 and C1, causing the oscillator for transmission TxVCO to oscillate at the frequency defined by the voltages charged across the capacitors C0 and C1. In consequence, the TxVCO generates a signal with the correct frequency and the correct phase that matches the phase of a modulation signal SREF output from the modulation circuit 120.

Though not shown in FIG. 1, the transmitter circuit of this embodiment comprises: an attenuator ATT between the coupler 220 and mixer 132, forming part of the amplitude control loop, for attenuating an output of the coupler 220 and supplying the mixer 132 with the attenuated output; and low pass filters MLPF1 and MLPF2 between the mixer 132 and variable gain amplification circuit MVGA and between the variable gain amplification circuit MVGA and amplitude detection circuit 150, respectively, for removing unwanted waves and harmonics, as illustrated in FIG. 2.

Furthermore, the transmitter circuit of this embodiment comprises, at the succeeding stage of the variable gain amplification circuit IVGA, a charge pump CGP for charging or discharging depending on a differential output of the variable gain amplification circuit IVGA to generate a voltage in accordance with an output of the variable gain amplification circuit IVGA, and a level shift circuit LVS for shifting the voltage generated by the charge pump CGP by approximately 0.6 V in the negative direction. The charge pump CGP is comprised of a pair of current sources IS1 and IS2, and a capacitor C4, and a switch SW11 is provided between the current sources IS1 and IS2 and the capacitor C4 for opening the loop.

An output node N1 of the charge pump CGP is connected to a precharge current source PCI for precharging this node N1 through a switch SW12. The transmitter circuit of this embodiment further comprises a level detection circuit DTC for comparing a signal from the modulation circuit 120 with a feedback signal SFB of the amplitude control loop to detect whether or not the feedback signal SFB reaches a predetermined level, and a flip-flop FF1 operated by an output signal of the level detection circuit DTC to generate an ON/OFF control signal for the switches SW11 and SW12.

The level detection circuit DTC is configured such that its output signal changes to high level when the feedback signal SFB reached −5.9 dBm. The feedback signal SFB at −5.9 dBm corresponds to the level of the feedback signal SFB when the output control terminal (VAPC) of the power module 200 is at a level such as −11 dBm. Generally, the switch SW11 is turned on while the switch SW12 is turned off to terminate a precharge when the level detection circuit DTC detects the arrival of the feedback signal SFB to a predetermined level. However, if the feedback signal SFB does not reach the predetermined level even after the precharge has lasted for a predetermined time (for example, 5 μsec), the flip-flop FF1 is reset by a control signal φ2 from the sequencer 180 to forcedly terminate the precharged.

When an attempt is made to ramp up the output power of the output power amplifier 210 from a very low level with the sole control of the amplitude control loop closed, a long time might be taken until the amplitude control loop is stabilized. If the precharge is performed, the output power of the output power amplifier is increased to a predetermined level within a prescribed time upon starting transmission. At this level, −11 dBm, the amplitude loop gain is high enough to ensure that the amplitude loop has enough phase margin and will operate in a stable way.

The precharge is performed to increase rapidly the output power to a level at which the loop gain of the power amplitude becomes constant, thereby making it possible to increase the output power of the output power amplifier 210 to the predetermined transmission level within the prescribed time without fail upon starting transmission. The shift circuit LVS is provided because the charge pump CGP is not capable of providing 0 V due to the nature of the current source IS2, whereas the charge pump is required to have the ability to apply a control voltage down to 0 V to the output power module 200.

Figure 3:
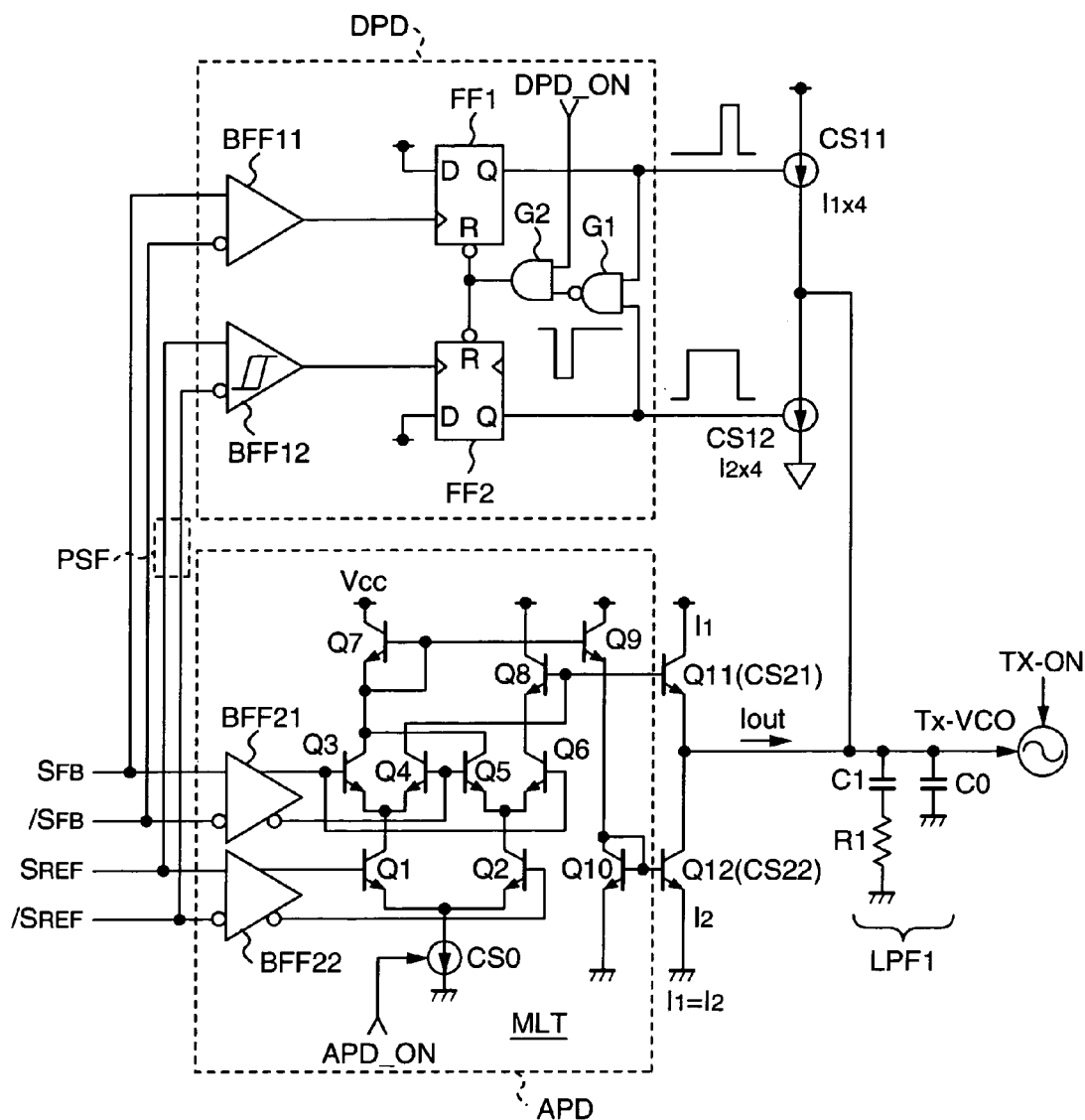
FIG. 3 is a circuit diagram illustrating a specific example of a phase detection circuit for use in the embodiment of the present invention.

FIG. 3 illustrates a specific example of the phase detection circuit 140 which comprises the digital phase comparator DPD and analog phase comparator APD.

The digital phase comparator DPD comprises: differential inputs—single output buffers BFF11 and BFF12, each of which receives differential input signals SFB and /SFB and reference signals SREF and /SREF; D-type flip-flops FF1 and FF2 which operate as latches by the buffers BFF11 and BFF12; a NAND gate G1 which receives outputs of the flip-flops FF1 and FF2; and an AND gate G2 which receives an output of the NAND gate G1 and an activation signal DPD_ON. The buffers BFF11 and BFF12 are desirably those circuits which have a function of a limiter for shaping the waveform of sinusoidal input signals to output shaped signals as square-wave signals.

The digital phase comparator DPD starts a phase comparison operation as the activation signal DPD_ON goes to high level. As the outputs of the buffers BFF11 and BFF12 rise, the flip-flops FF1 and FF2 operate as latches to provide outputs at high level. As both outputs of the two flip-flops FF1 and FF2 go to high level, the flip-flops FF1 and FF2 are reset through the NAND gate G1.

As a result, one of the flip-flops FF1 and FF2, which advances in phase, generates an output pulse, the pulse width of which is wider than another output pulse of the other flip flop, causing a current of the current source CS11 or CS12 to flow extra by the difference in pulse width. This extra current causes change in a voltage charged across the capacitors C0 and C1 of the loop filter LPF1 and a resulting change in the control voltage supplied to the oscillator for transmission TxVCO to advance or delay the phase of the output. At the time the input signal SFB matches with the reference signal SREF in phase, a charge current of the current source CS11 is in balance with a discharge current of the current source CS12 to provide constant voltages charged on the capacitors C0 and C1 of the loop filter LPF1, resulting in a locked state.

Figure 4:
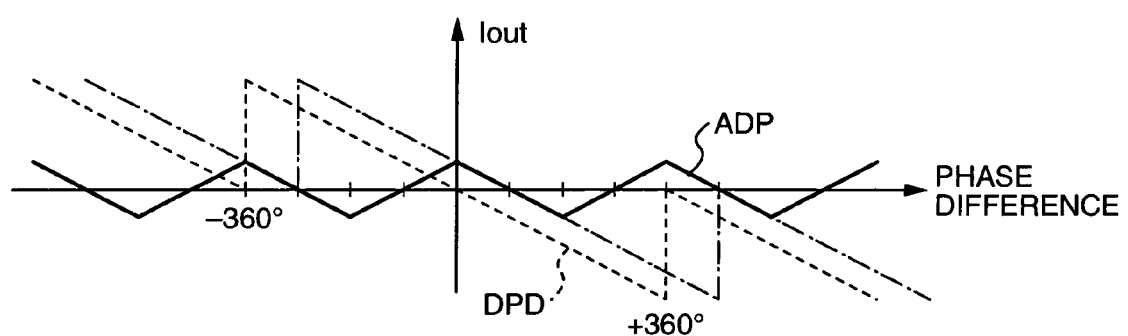
FIG. 4 is a graph showing a relationship between a phase difference of input signals and an output current in the phase detection circuit of FIG. 3.

In this event, the digital phase comparator DPD generates an output current Iout at "0" when the phase difference is at −360°, 0° or +360° to enter the loop into the locked state, as indicated by a broken line in FIG. 4. As is apparent from a comparison of the broken line with a solid line which indicates the waveform of an output current of the analog phase comparator APD, the digital phase comparator DPD has a phase draw range over 720°, which is much wide than that of the analog phase comparator APD over 180°. In addition, since the digital phase comparator DPD has only one point at which the loop enters the locked state, an image lock is unlikely to occur. Thus, rapid phase drawing (8 μsec or shorter) can be accomplished by first drawing the phase of the loop by the digital phase comparator DPD.

However, as described above, the digital phase comparator DPD is disadvantageous in that spurious noise is introduced into the output of the oscillator for transmission TxVCO due to a pass current which is generated by a charge current of the current source CS11 and a discharge current of the current source CS12 at the time the input signal SFB matches with the reference signal SREF in phase. Thus, by switching the digital phase comparator DPD to the analog phase comparator APD by the control signals DPD_ON and APD_ON after the phase is locked by the digital phase comparator DPD, a lock-up time can be reduced while avoiding the occurrence of noise upon transmission and reception. The control signals DPD_ON and APD_ON can be provided from the sequencer 180 shown in FIG. 1.

The analog phase comparator APD comprises: as shown in FIG. 3, differential inputs—differential output buffers BFF21 and BFF22, each of which receives differential input signals SFB and /SFB and reference signals SREF and /SREF; and a multiplier circuit MLT which receives outputs of the buffers BFF21 and BFF22.

The multiplier circuit MLT is composed of: a differential pair of transistors Q1 and Q2 which receive a differential output of the buffer BFF22 at their bases; a constant current source CS0 connected to a common emitter of Q1 and Q2; a differential pair of transistors Q3 and Q4 which have a common emitter connected to a collector of Q1 and receive a differential output of the buffer BFF21 at their bases; a differential pair of transistors Q5 and Q6 which have a common emitter connected to a collector of Q2 and receive a differential output of the buffer BFF21 at their bases; a transistor Q7 connected between the collector of Q3 and a power supply voltage Vcc; a transistor Q8 connected between the collector of Q6 and the power supply voltage Vcc; a transistor Q9 connected in current mirror configuration with the transistor Q7; and a transistor Q10 connected in series with Q7. Then, the transistor Q8 and the transistor Q11 acting as the constant current source CS21 of the charge pump are connected in current mirror configuration. The transistor Q10 and the transistor Q12 acting as the constant current source CS22 of the charge pump are likewise connected in current mirror configuration.

The analog phase comparator APD is activated as the constant current source CS0 is turned on by the control signal APD_ON to start a comparison in phase between the input signal SFB and reference signal SREF, and outputs a current Iout in accordance with the phase difference as indicated by a solid line in FIG. 4. As can be seen from comparison between the output current characteristic (indicated by a solid line) of the analog phase comparator APD with the output current characteristic (indicated by a broken line) of the digital phase comparator DPD shown in FIG. 4, the phase is locked by the digital phase comparator DPD when the phase difference is zero, whereas the phase is locked by the analog phase comparator APD when the phase difference is ±90°.

For this reason, even if the digital phase comparator DPD is switched to the analog phase comparator APD after the phase of the loop is locked by the digital phase comparator, the analog phase comparator APD locks the phase (re-synchronized) with the phase shifted by 90° without fail after the switching. It should be noted that this re-synchronization generally takes 1 μsec or shorter, thus causing substantially no problem. As another concern, the control voltage supplied to the oscillator for transmission TxVCO may slightly fluctuate. Therefore, if the phase detection circuit 140 is affected by the time required for the re-synchronization and the fluctuations in the VCO control voltage, a phase shifter for shifting the phase by 90° may be provided at a location, for example, as indicated by a broken line PSF in FIG. 3 to shift the phase of the reference signals SREF and /SREF input to the digital phase comparator DPD by 90°.

The provision of such a phase shifter shifts the output current characteristic of the digital phase comparator DPD, as indicated by a one-dot chain line in FIG. 4, to match the phase lock point in the digital phase comparator DPD with the phase lock point in the analog phase comparator APD to prevent a delay and fluctuations in the control voltage in the switching. The phase shifter may be provided at a location on the input side of the analog phase comparator APD rather than the input side of the digital phase comparator DPD.

Figure 5:
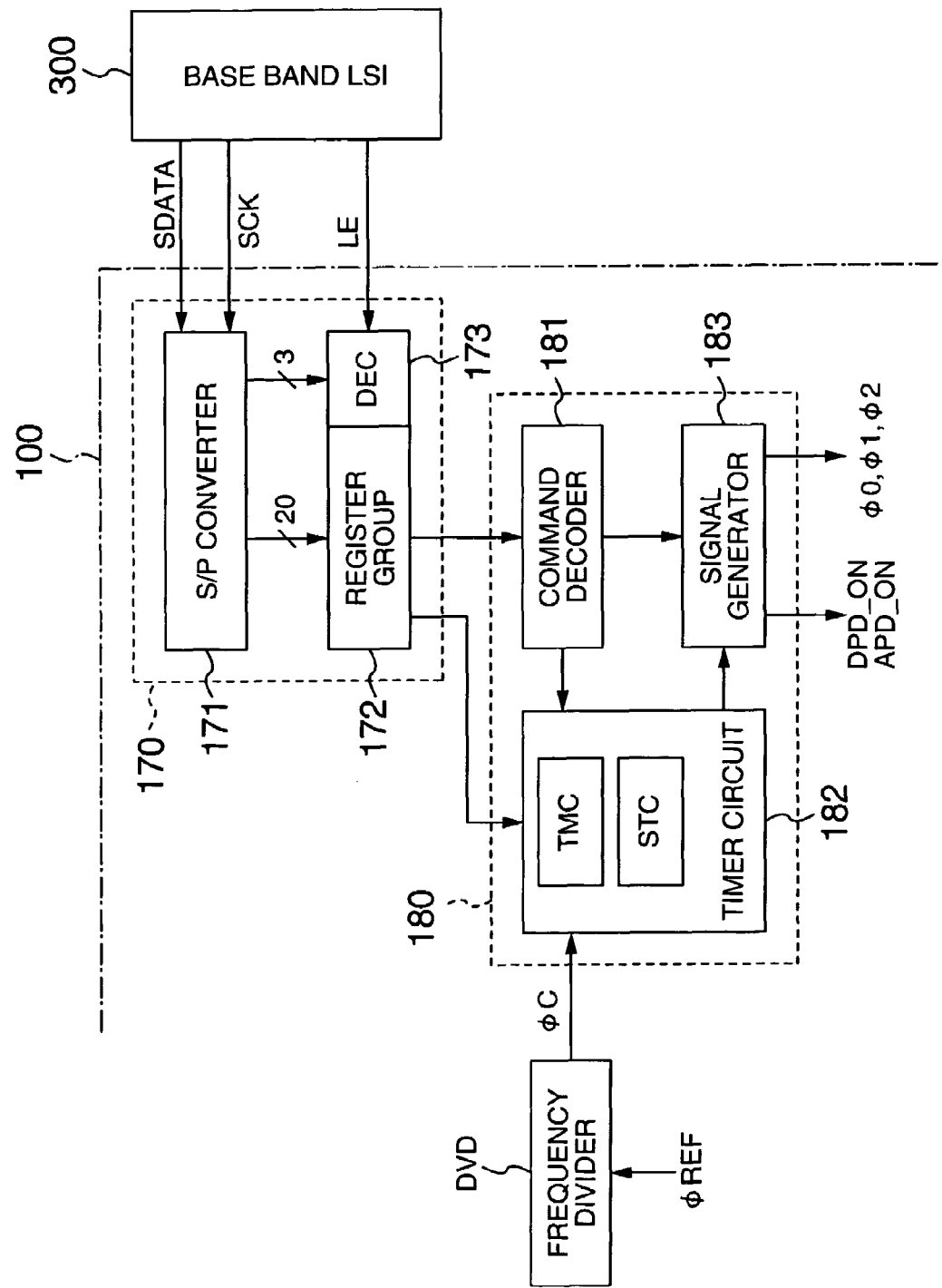
FIG. 5 is a circuit diagram illustrating an exemplary configuration of a sequencer in the embodiment of the present invention.

FIG. 5 illustrates an exemplary configuration of the register 170 and sequencer 180 for generating the control signals DPD_ON and APD_ON for controlling the phase detection circuit 140 within the transmitter circuit, and signals φ0, φ1 and φ2 for controlling the switches SW0, SW1, SW11 and SW12 and the like based on commands from the baseband LSI 300 and values set in the register 170 to ramp up the output power of the output power amplifier 210 for transmission.

The register 170 comprises: a serial/parallel conversion circuit 171 for fetching serial data SDATA supplied from the baseband LSI 300, for example, in units of 24 bits in synchronism with a clock SCK supplied likewise from the baseband LSI 300 to convert the serial data SDATA into parallel data: a group of data registers 172 comprised of a plurality of registers for holding upper 21 bits of the data converted by the serial/parallel conversion circuit 171; a decoder circuit 173 for decoding the lower three bits of the data fetched into the serial/parallel conversion circuit 171 to generate a signal for specifying a resister for holding the upper 21 bits of the data; and the like. The decoder 173 and registers 172 operate, respectively, in response to a load enable signal LE supplied from the baseband LSI 300.

The sequencer 180 in turn comprises: a command decoder 181 for decoding a command code of data fetched into the registers 172 to generate an internal control signal; a timer circuit 182 for measuring the time for generating a timing signal in accordance with a command supplied from the baseband LSI 300; a signal generation circuit 183 for generating signals for controlling the transmitter circuit such as the control signals DPD_ON, APD_ON, φ0, φ1 and φ2 and the like; and the like.

The timer circuit 182 comprises a timer counter TMC which operates as a counter in response to a clock φc generated by dividing the frequency of an oscillation signal within the high frequency IC 100 (for example, the reference signal φREF generated by the oscillator RF-VCO) by a frequency divider circuit DVD; and a step counter STC which starts counting up when the timer counter TMC times up. The command decoder 181 selects predetermined timing setting data from data stored in the registers 172 in accordance with a command input thereto and sets the selected data in each timer counter TMC for start-up.

As the started timer counter TMC times up, the timer counter TMC is set to data of time which should be next measured by the timer counter TMC, and is restarted. As the timer counter TMC times up, the step counter STC counts up. The value (step number) of the step counter STC is supplied to the signal generation circuit 183, followed by a transition to the next step, where the signal generation circuit 183 generates and outputs an internal control signal, in accordance with the step number, which changes at a predetermined timing.

Figure 6:
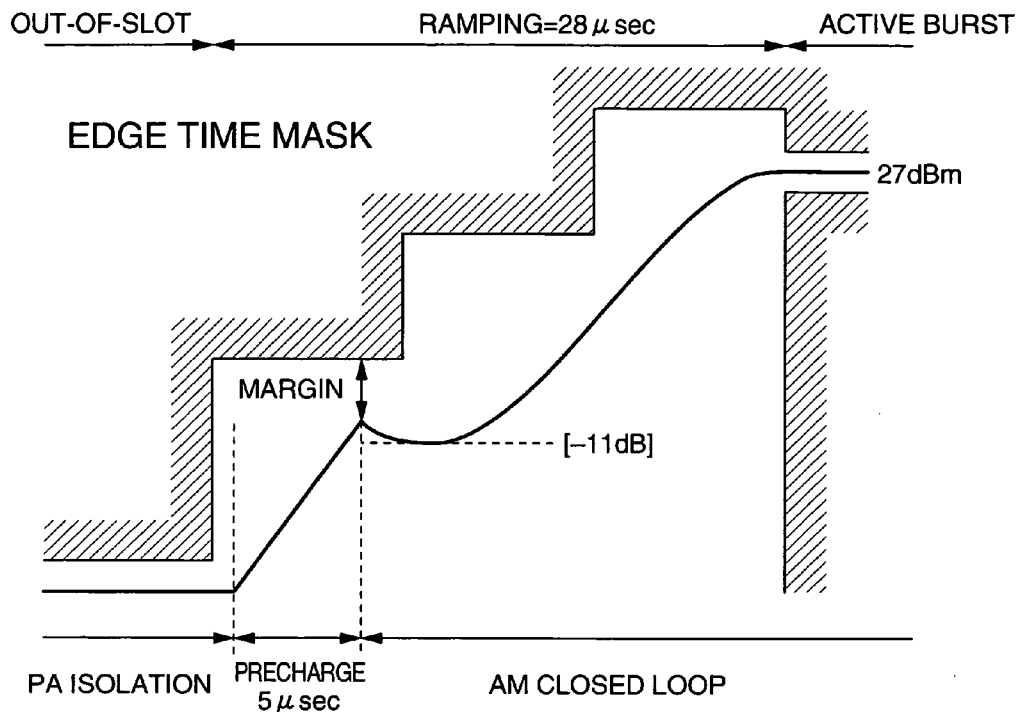
FIG. 6 is an explanatory diagram showing a relationship between a change in output level upon ramping up the output power from the polar loop based transmitter circuit according to an embodiment of the present invention and a time mask when a required output level, prescribed in the GSM system standard, is high.
Figure 7:
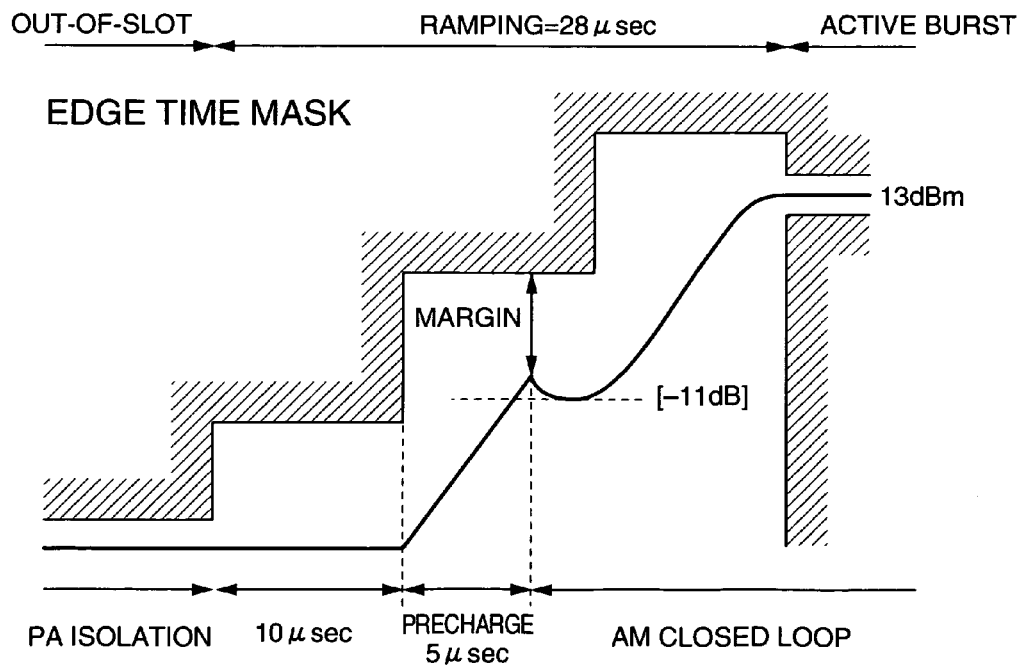
FIG. 7 is an explanatory diagram showing a relationship between a change in output level upon ramping up the output power from the polar loop based transmitter circuit according to an embodiment of the present invention and a time mask when a required output level, prescribed in the GSM system standard, is low.
Figure 8:
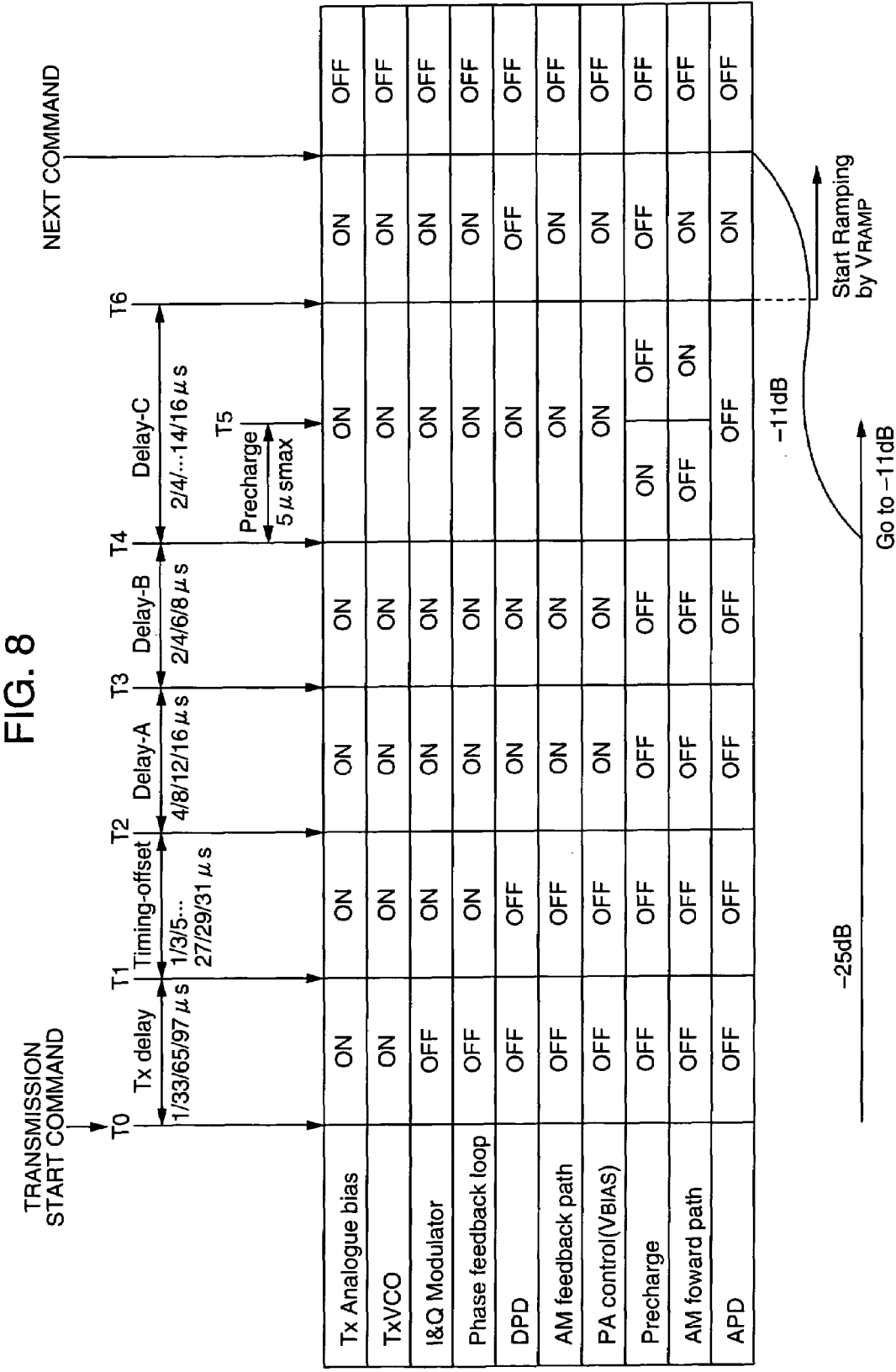
FIG. 8 is a time chart illustrating an operation procedure for ramping up the output power in an 8-PSK modulation mode performed by the transmitter circuit according to the embodiment of the present invention.

Referring next to FIGS. 6, 7 and 8, description will be made on the output power ramp-up operation of the polar loop based transmitter circuit according to this embodiment for starting transmission in the EDGE modulation mode. FIGS. 6 and 7 show examples of a time mask which is defined by the standard of the EDGE system, and FIG. 8 is a time chart showing in time series the operation of each component in the transmitter circuit in the 8-PSK modulation mode. FIG. 6 shows a time mask and an associated ramp-up operation when a required output level is relatively high such as 27 dBm at a location relatively far from a base station, while FIG. 7 shows a time mask and an associated ramp-up operation when a required output level is relatively low such as 13 dBm at a location close to a base station. Although not shown, in the GMSK modulation mode, it is defined that the output power is ramped up to a level such as 33 dBm in a predetermined time.

In the operation for ramping up the output power, the oscillator for transmission TxVCO is first started to oscillate (period T0-T1 in FIG. 8).

After the oscillator for transmission TxVCO is activated at timing T0, the baseband LSI 300 sends I and Q signals at timing T1 to the modulation circuit 120 to modulate an intermediate frequency signal φIF, supplies the modulated signal to the phase detection circuit 140 and amplitude detection circuit 150, and turns on the phase loop but not yet phase detection (period T1-T2 in FIG. 8). In this way, a transmission signal of the oscillator for transmission TxVCO is downconverted by the mixer 131 and fed back to the phase detection circuit 140.

Next, at timing T2, the digital phase comparator DPD is turned on to compare the phase of the feedback signal SFB from the oscillator for transmission TxVCO with that of the modulated signal SREF to start a control for matching the phases of the two signals with each other (period T2-T3 in FIG. 8). In this event, the amplitude detection circuit 150 also starts a comparison in amplitude between a detection signal input thereto from the coupler 220 through the feedback path with the modulated signal SREF (however, a forward path of the amplitude control loop is off).

Also, the power module 200 starts a control in response to a bias voltage VBIAS supplied from the baseband LSI 300. The capacitor C4 is precharged to 0.6 V, a voltage level that guarantees a maximum level of 100 mV at the VAPC input. Then, this state is held for a predetermined time to wait for the phase loop to be locked (period T3-T4 in FIG. 8).

Next, at time T4 the flip-flop FF1 is reset by the control signal φ2 to turn off the switch SW11 on the forward path of the amplitude control loop in response to the output of the flip-flop FF1 to open the loop, and to turn on the switch SW12 to start precharging the capacitor C4 pump by the current source PCI for precharge (at timing T4 in FIG. 8) until the voltage reaches a level that corresponds to −11 dBm at the power amplifier output. Subsequently, when the level detection circuit DTC determines that the modulated signal SREF matches with the feedback signal SFB from the amplitude control loop in level, the flip-flop FF1 is operated as a latch by the level detection circuit DTC to change its output. The changed output turns off the switch SW12 to stop precharging the capacitor C4, and turns on the switch SW11 on the forward path to close the amplitude control loop to start the amplitude control (at timing T5 in FIG. 8). Also, in this event, the switch SW0 is switched to change the feedback signal to the phase comparator from the signal supplied from the phase control loop to the signal supplied from the main phase control loop (the feedback path of the amplitude control loop.

Also, in this event, as a predetermined time (for example, 5 μsec) has elapsed before the level detection circuit DTC, the flip-flop FF1 is released from the reset state by the control signal φ2 from the sequencer 180 to forcedly terminate the precharge. This system prevents unlocking problems to happen and stops the precharge before it may become dangerous. In this way, the output of the power amplifier 210 is raised to such a level as −11 dBm, at which the amplitude control loop may converge rapidly (T5-T6 period).

Subsequently, the output control voltage VRAMP is varied from the baseband LSI 300 shortly after T6 to ramp up the output power of the power module 200 to a desired level. At timing T6, in the phase control loop, the digital phase detector DPD is switched to the analog phase detector APD and settled very quickly. In this event, the switch S0 may be switched to change the feedback signal to the phase comparator from the signal supplied from the subsidiary phase control loop to the signal supplied from the main phase control loop.

In this embodiment, the foregoing operation in accordance with the time chart of FIG. 8 is automatically executed by the sequencer 180 by sending a transmission start command an setting data from the baseband LSI 300 to the register 170 of the high frequency IC 100. As a result, the output power of the power amplifier 210 can be raised up within a time mask prescribed in the EDGE scheme (nearly the same applies to the GMSK scheme).

When the required output level is relatively low, the output power can be ramped up within the prescribed time mask by delaying the start of precharge by a predetermined time, for example, 10 μsec, as shown in FIG. 7. The operation for delaying the start of precharge by 10 μsec may be executed, for example, by changing data set in the register 170 associated with the time between timings T1 and T2 in FIG. 8, measured by a timer.

Figure 9:
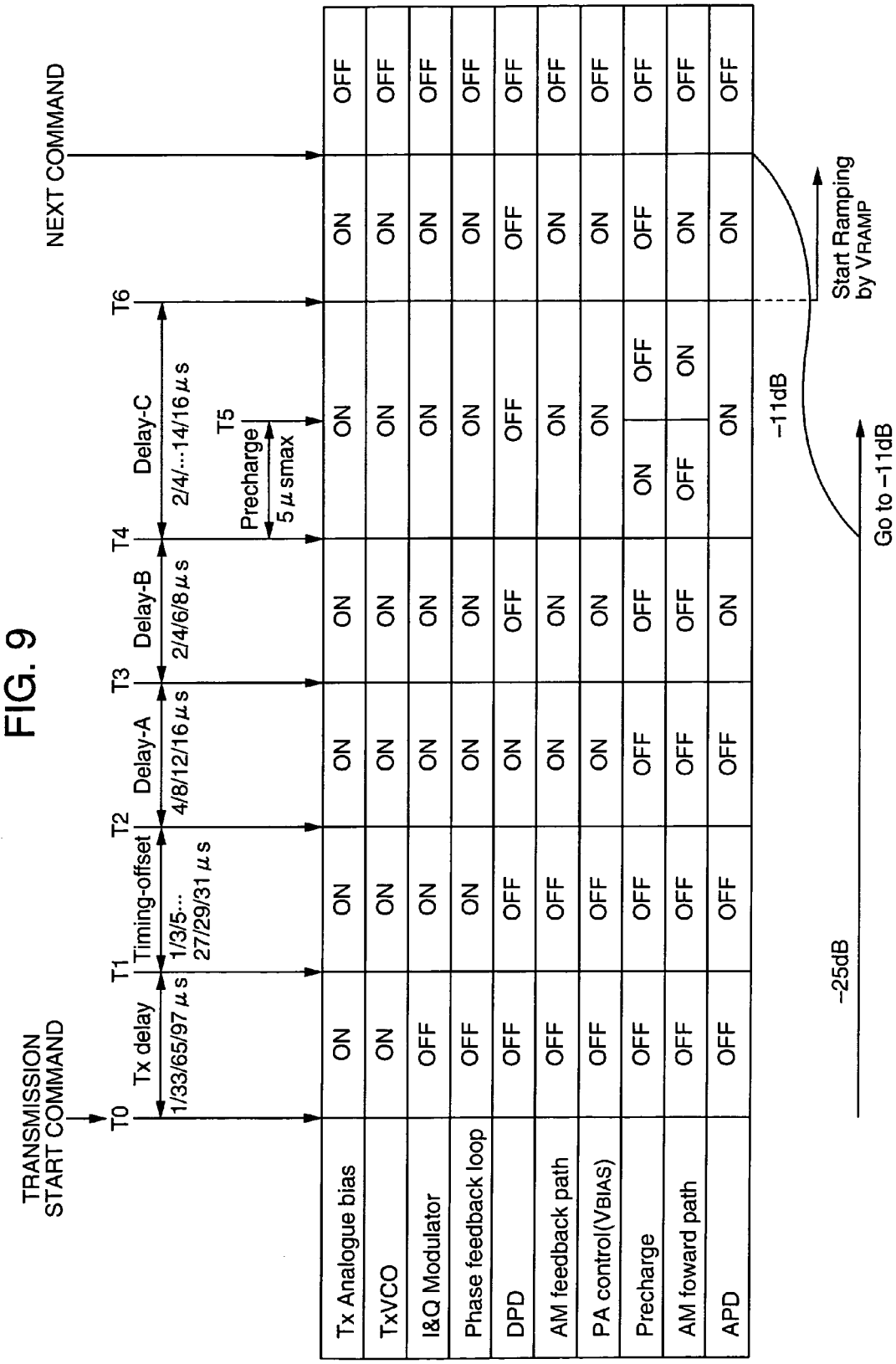
FIG. 9 is a time chart illustrating an operation procedure for ramping up the output power in a GMSK modulation mode when an amplitude control loop is used in the transmitter circuit according to the embodiment of the present invention.

FIG. 9 illustrates an operation procedure (GMSK-Type I) for controlling the output power of the power amplifier 210 by generating a voltage VAPC for controlling the power module 200 based on the output control voltage VRAMP supplied from the baseband LSI 300 to the high frequency IC 100 utilizing the amplitude loop in the GMSK modulation mode in the transmitter circuit of this embodiment. The operation procedure in FIG. 9 differs from that in FIG. 8 only in that the digital phase detector DPD is switched to the analog phase detector APD at a different moment T3 instead of T6. In the operation procedure in FIG. 9, as feedback signal to the phase comparator, only the signal from the subsidiary phase control loop is used and not the signal from the main phase control loop (the main feedback loop is used only as feedback for the amplitude loop).

Though not shown in FIG. 9, when the amplitude control loop is utilized in the GMSK modulation mode, the switch SW2 on the amplitude control loop is changed over to use the lower-order filter (load) LPF3 so that the amplitude loop is of type I order. The switching to the filter LPF3 provides a larger phase margin for the amplitude loop and more reliability. The switching from DPD to APD does not need the main loop to be activated. So it can happen at T3.

Figure 10:
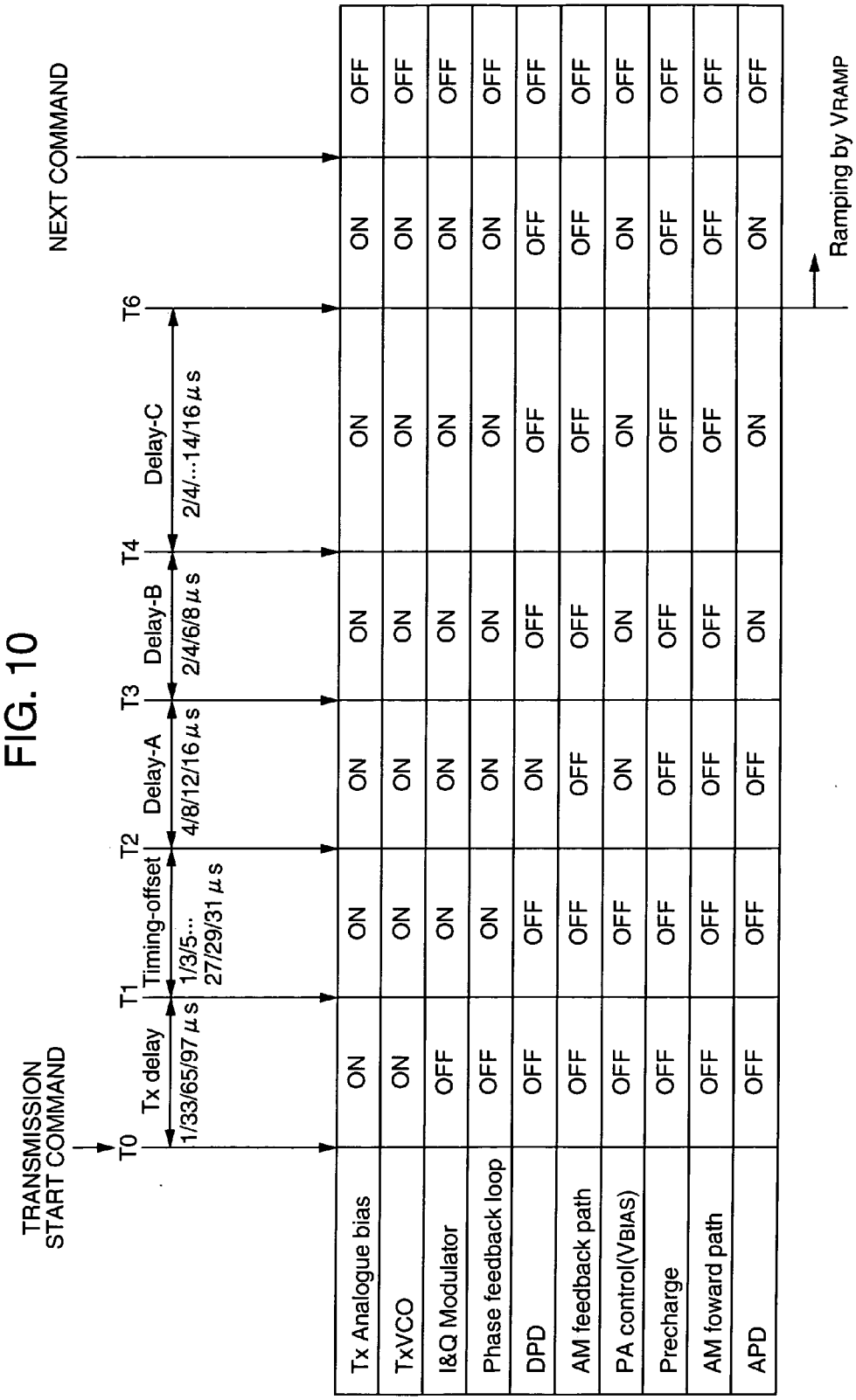
FIG. 10 is a time chart illustrating an operation procedure for ramping up the output power in a GMSK modulation mode when an amplitude control loop is not used in the transmitter circuit according to the embodiment of the present invention.

FIG. 10 illustrates an operation procedure (GMSK-Direct) for controlling the output power of the power module 200 in the GMSK modulation mode, without utilizing the amplitude control loop in the transmitter circuit of this embodiment. The VAPC signal is controlled by the voltage VRAMP for the baseband LSI 300.

The operation procedure in FIG. 10 differs from that in FIG. 9 in that the feedback path and forward path of the amplitude control loop are continuously turned off since the amplitude loop is not used, and that no precharge is performed on the amplitude control loop. In addition, the power module 200 may or may not be controlled by the bias voltage VBIAS. This is because a constant bias voltage VBIAS can be applied internally to the power module 200 when the amplitude control loop is not utilized and as soon as the power amplifier is turned on.

In the transmitter circuit of this embodiment, the high frequency IC 100 may eventually contain the output power control function which can support the GMSK modulation required by a GMSK system, and has been so far provided by an external IC in the conventional GMSK system. In addition, the high frequency IC 100 of this embodiment can be used as well in a conventional GMSK system having an APC circuit.

Figure 11:
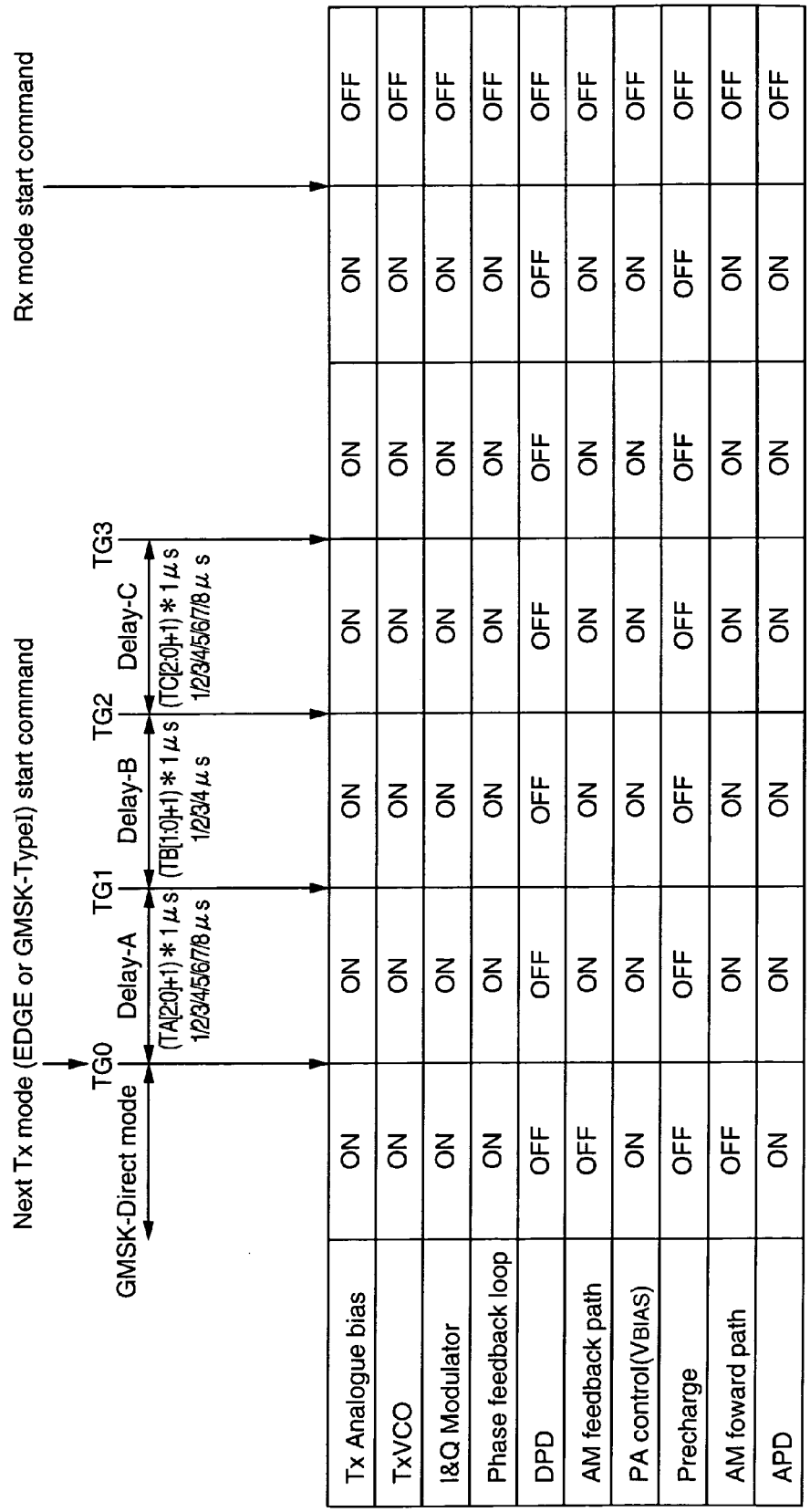
FIG. 11 is a sequence table illustrating an operation procedure of an internal circuit when the transmission mode is switched from GMSK-Direct to EDGE or GMSK-Type I.
Figure 12:
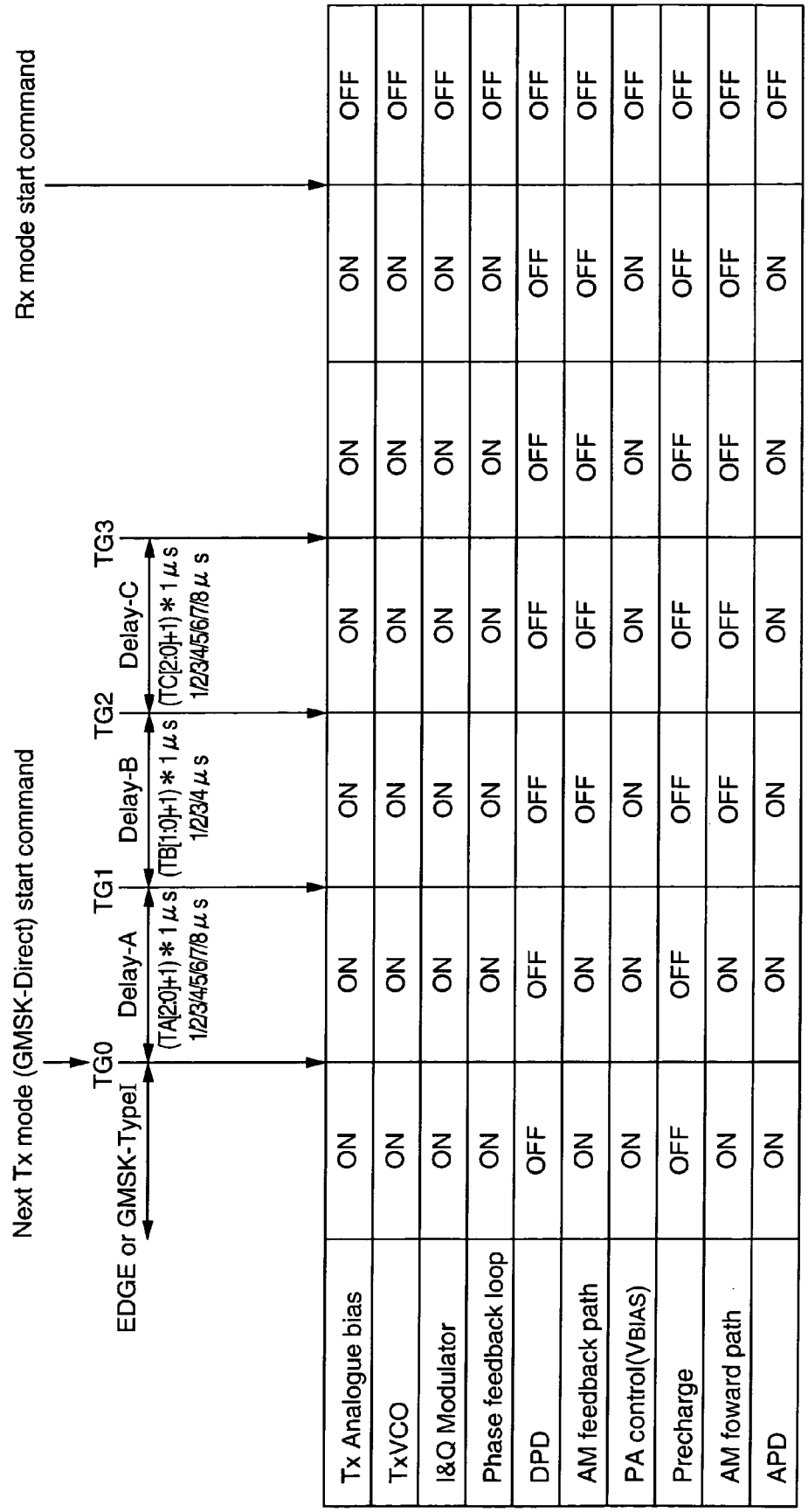
FIG. 12 is a sequence table illustrating an operation procedure of an internal circuit when the transmission mode is switched from EDGE or GMSK-Type I to GMSK-Direct.

Next, with reference to FIG. 11, and FIGS. 14A-14F, description will be made on a control operation when a slot is switched and the transmission mode is changed to a different transmission mode GMSK to EDGE or EDGE to GMSK. FIG. 14 shows how the output level of the power amplifier 210 changes upon switching between the six transmission modes available to the system adopting the polar loop scheme of this embodiment. FIG. 11 is a sequence table illustrating switching from GMSK-Direct to EDGE or GMSK-Direct to GMSK-Type I shown in FIGS. 14A and 14C. FIG. 12 is a sequence table illustrating switching from GMSK-Type I to GMSK-Direct or EDGE to GMSK-Direct shown in FIGS. 14D and 14F.

Figure 13:
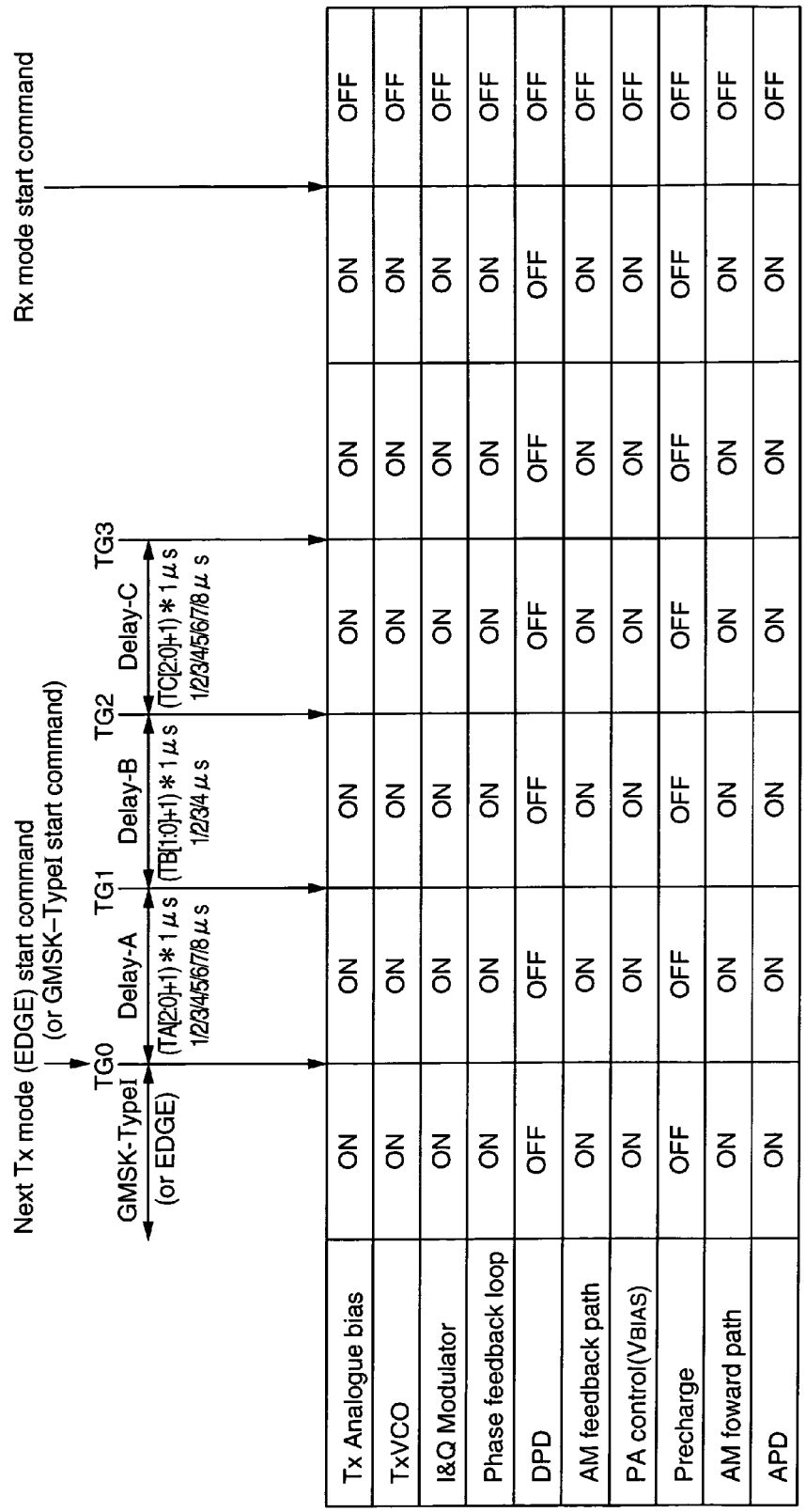
FIG. 13 is a sequence table illustrating an operation procedure of an internal circuit when the transmission mode is switched from GMSK-Type I to EDGE or from EDGE to GMSK-Type I.
Figure 14A:
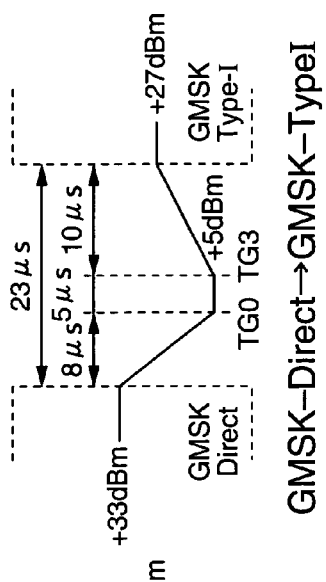
FIGS. 14A, 14B, 14C, 14D, 14E, and 14F are time charts illustrating how the output level of a power amplifier 210 changes when the six types of transmission modes available by a polar loop based system of an embodiment of the present invention are switched.
Figure 14B:
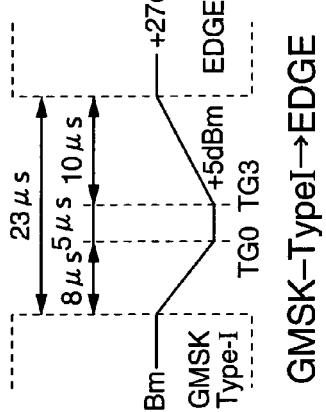
Figure 14C:
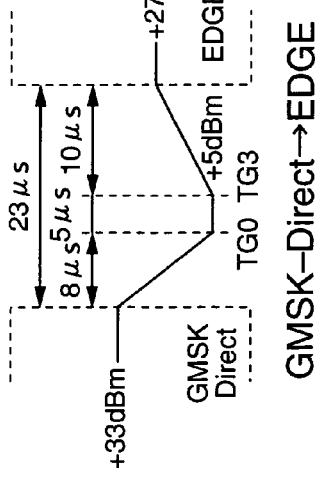
Figure 14D:
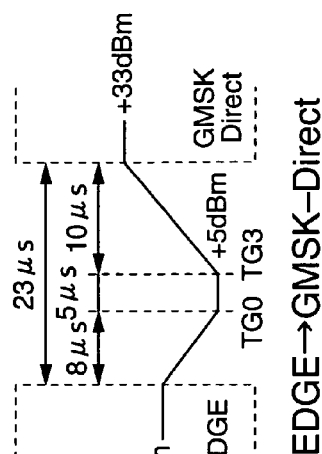
Figure 14E:
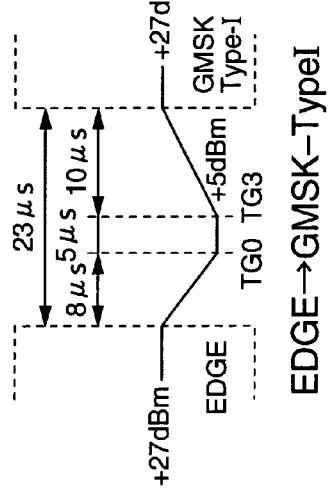
Figure 14F:
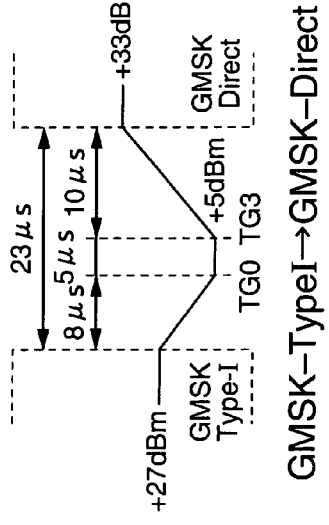

FIG. 13 is a sequence table illustrating switching from GMSK-Type I to EDGE shown in FIG. 14B. The sequence table for switching from EDGE to GMSK-Type I is the same as the sequence table for switching from GMSK-Type I to EDGE, and so this table is omitted.

As shown in FIGS. 14A-14F, in this embodiment, when the transmission mode is switched, the output level of the power amplifier 210 is once lowered to +5 dBm or 0 dBm in 8 μsec, then the circuit in the high frequency IC 100 is changed in 5 μsec, and thereafter the output level is ramped up depending upon the switched mode, to maximum +27 dBm for the EDGE mode and to maximum +33 dBm for the GMSK mode. The output level of the power amplifier 210 is ramped up smoothly in about 8 μsec to 10 μsec.

In this embodiment, switching the transmission mode starts when a command is supplied from the baseband LSI 130 to the high frequency IC 100. As seen from FIG. 13, during the switching from GMSK-Type I to EDGE, the control loop in the high frequency IC 100 is quite the same as that before switching. During this period, lowering and ramping up the output level of the power amplifier 210 is performed only by lowering and ramping up the control voltage VRAMP from the baseband LSI 300.

In FIGS. 11 to 13, timing TG0 is the timing when the output level of the power amplifier 210 reaches 5 dBm as indicated by TG0 in FIGS. 14A-14F, and shortly after timing TG3 is the timing when the output level of the power amplifier 210 starts rising as indicated by TG3 in FIG. 14. Lowering and ramping up the output level of the power amplifier 210 shown in FIGS. 14A-14F is performed by using the control voltage VRAMP from the baseband system LSI 300.

Therefore, the time of 8 μs taken to lower the output level of the power amplifier 210 and the time of 10 μsec taken to ramp up the output level are managed by the baseband LSI 130. The period from timing TG0 to timing TG3 corresponds to the time (5 μsec) taken to change the settings of the internal circuit of the high frequency IC 100 for transmission mode switching. This period is managed by the timer circuit 182 in the sequencer 180.

In this embodiment, at the timing TG0 the baseband LSI 300 sends a predetermined command to the high frequency IC 100 after the output level of the power amplifier 210 has been lowered by the control voltage VRAMP. The sequencer 180 of the high frequency IC 100 analyzes the command code and changes the settings of the internal circuit of the high frequency IC 100 so as to match with the next transmission mode, in accordance with the timings TG0 to TG3 of the tables shown in FIGS. 11 to 13.

As seen from FIG. 11, for switching from GMSK-Direct to EDGE or GMSK-Type I, the sequencer 180 changes the settings of the internal circuit so that the feedback path and main loop of the amplitude control loop changes from the off-state to the on-state at the timing TG0. The phase loop also takes the feedback path of the main loop if the new mode is EDGE. But the phase loop settings do not change if the new mode is GMSK.

As seen from FIG. 12, for switching from EDGE or GMSK-Type I to GMSK-Direct, the sequencer 180 makes the settings of the internal circuit so that the feedback path and main loop of the amplitude control loop changes from the on-state to the off-state at the timing TG1.

Description has been made on the transmission switching when the radio communication system is remote from a base station and a required output level is high (corresponding to FIG. 6). The transmission switching is easier when the radio communication system is close to a base station. It is possible to smooth the lowering slope to the timing TG0 and the ramping slope from the timing TG3 shown in FIGS. 14A-14F. If the adverse effect on nearby channels to be caused by the degradation of the frequency spectrum can be avoided under the severe conditions that the required output level is high as in this embodiment, it is obvious that the adverse effect on nearby channels can be avoided when the required output level is low.

The invention made by the present inventors have been described specifically. The invention is not limited only to the embodiments, but it is obvious that various modifications are possible without departing from the spirits and scope of the invention. For example, although external inductor elements may be used for oscillation of TxVCO, or on-chip inductors having desired characteristics can be formed instead of the external elements. In the second embodiment shown in FIG. 4, although signals at the input pins P1 and P2 are input to the emitters of differential input transistors Q1 and Q2 via resistors R15 and R17 and capacitors C11 and C12, the signals at the input pins P1 and P2 may be input to the bases of Q1 and Q2.

Although the embodiments are applied to the radio communication system of the polar loop scheme having a phase control loop and an amplitude control loop, the present invention may be widely applied to high frequency ICs and radio communication systems of the type that the main part of a transmission oscillator is implemented on a chip, an oscillation signal is output from an external terminal of the high frequency IC and a detection signal of an output of a power amplifier is fed back to the high frequency IC from an external of the chip.

In the foregoing description, the invention is applied to a triple-band type system capable of communications of three systems including a GSM system, a DCS1800 system and a PCS1900 system. The invention is also applicable systems capable of communications of one or two of the GSM system, DCS1800 system and PCS1900 system, such as a dual-band type or even a quad-band type system.

The effects obtained by the typical invention disclosed in the application will be described briefly in the following.

According to the invention, in the radio communication system having a phase control loop for phase modulation and an amplitude control loop for amplitude modulation and being capable of time divisional transmission and reception under a predetermined time management, lowering and ramping up the output level of a power amplifier can be completed within a predetermined time for switching between transmission modes.

Further, lowering and ramping up the output level of a power amplifier can be automatically executed and completed within a predetermined time for switching between transmission modes upon reception of a predetermined command.

Furthermore, continuous transmission is possible in a plurality of modes having different modulation methods by using common feedback control loops, and lowering and ramping up the output level of a power amplifier can be completed within a predetermined time for switching between transmission modes.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method of ramping up an output level of a power amplifier of a radio communication system having a transmission oscillator, a phase detection circuit for comparing a phase of a reference signal with a phase of a feedback signal to control the transmission oscillator in accordance with a detected phase difference, said power amplifier which amplifies an oscillation signal generated by the transmission oscillator, and an amplitude detection circuit for comparing an amplitude of a reference signal with an amplitude of a feedback signal to control the power amplifier in accordance with a detected amplitude difference, wherein the radio communication system transmits, by phase modulation, a transmission signal by using a phase control loop including the phase detection circuit, and transmits, by phase and amplitude modulation, a transmission signal by using the phase control loop and an amplitude control loop including the amplitude detection circuit, said method of ramping up an output level of a power amplifier comprising steps of:

performing activation of the transmission oscillator, establishment of the phase control loop including the phase detection circuit, establishment of the amplitude control loop including the amplitude detection circuit, and ramp-up of the output level of the power amplifier, in this order recited, for activation of transmission related circuits; and lowering the output level of the power amplifier to a predetermined level higher than a level when the transmission related circuits are activated, while the transmission oscillator is maintained to operate, and thereafter ramping again the output level of the power amplifier without activation of the transmission oscillator, establishment of the phase control loop and establishment of the amplitude control loop, when transmission by phase modulation is switched to transmission by phase and amplitude modulation or when transmission by phase and amplitude modulation is switched to transmission by phase modulation, wherein after establishment of the phase control loop and before establishment of the amplitude control loop including the amplitude detection circuit, by using precharging means provided on a forward path in the amplitude control loop from the amplitude detection circuit to the power amplifier, the forward path is precharged up to a predetermined level faster than when an output of the amplitude detection circuit is used.

2. A method of ramping up an output of a power amplifier according to claim 1, wherein transmission by the phase modulation has a first mode in which the output level of the power amplifier is indirectly controlled by using the amplitude control loop and a second mode in which the output level of the power amplifier is directly controlled without using the amplitude control loop; and when transmission in the first mode is switched to transmission in the second mode or when transmission in the second mode is switched to transmission in the first mode, the output level of the power amplifier is lowered to the predetermined level higher than the level when the transmission related circuits are activated, while the transmission oscillator is maintained to operate, and thereafter ramping again the output level of the power amplifier without operating the precharge means.

3. A method of ramping up an output level of a power amplifier of a radio communication system having a transmission oscillator, a phase detection circuit for comparing a phase of a reference signal with a phase of a feedback signal to control the transmission oscillator in accordance with a detected phase difference, said power amplifier which amplifies an oscillation signal generated by the transmission oscillator, and an amplitude detection circuit for comparing an amplitude of a reference signal with an amplitude of a feedback signal to control the power amplifier in accordance with a detected amplitude difference, wherein the radio communication system transmits, by phase modulation, a transmission signal by using a phase control loop including the phase detection circuit, and transmits, by phase and amplitude modulation, a transmission signal by using the phase control loop and an amplitude control loop including the amplitude detection circuit, said method of ramping up an output level of a power amplifier comprising steps of:

performing activation of the transmission oscillator, establishment of the phase control loop including the phase detection circuit, establishment of the amplitude control loop including the amplitude detection circuit, and ramp-up of the output level of the power amplifier, in this order recited, for activation of transmission related circuits; and lowering the output level of the power amplifier to a predetermined level higher than a level when the transmission related circuits are activated, while the transmission oscillator is maintained to operate, and thereafter ramping again the output level of the power amplifier without activation of the transmission oscillator, establishment of the phase control loop and establishment of the amplitude control loop, when transmission by phase modulation is switched to transmission by phase and amplitude modulation or when transmission by phase and amplitude modulation is switched to transmission by phase modulation, wherein the phase control loop includes a first phase control loop for supplying a feedback signal from an output side of the transmission oscillator to the phase detection circuit, and a second phase control loop for supplying a feedback signal from an output side of the power amplifier to the phase detection circuit, and establishment of the phase control loon is performed first for the first phase control loop and next for the second phase control loop, and wherein when transmission only by the phase modulation is activated, after establishment of the phase control loop and before establishment of the amplitude control loop including the amplitude detection circuit, by using precharge means provided on a forward path in the amplitude control loop from the amplitude detection circuit to the power amplifier, the forward path is precharged up to a predetermined level faster than when an output of the amplitude detection circuit is used, and after precharge by the precharge means, the phase control loop is switched from the first phase control loop to the second phase control loop.

4. A method of ramping up an output level of a power amplifier of a radio communication system having a transmission oscillator, a phase detection circuit for comparing a phase of a reference signal with a phase of a feedback signal to control the transmission oscillator in accordance with a detected phase difference, said power amplifier which amplifies an oscillation signal generated by the transmission oscillator, and an amplitude detection circuit for comparing an amplitude of a reference signal with an amplitude of a feedback signal to control the power amplifier in accordance with a detected amplitude difference, wherein the radio communication system transmits, by phase modulation, a transmission signal by using a phase control loop including the phase detection circuit, and transmits, by phase and amplitude modulation, a transmission signal by using the phase control loop and an amplitude control loop including the amplitude detection circuit, said method of ramping up an output level of a power amplifier comprising steps of:

performing activation of the transmission oscillator, establishment of the phase control loop including the phase detection circuit, establishment of the amplitude control loop including the amplitude detection circuit, and ramp-up of the output level of the power amplifier, in this order recited, for activation of transmission related circuits; and lowering the output level of the power amplifier to a predetermined level higher than a level when the transmission related circuits are activated, while the transmission oscillator is maintained to operate, and thereafter ramping again the output level of the power amplifier without activation of the transmission oscillator, establishment of the phase control loop and establishment of the amplitude control loop, when transmission by phase modulation is switched to transmission by phase and amplitude modulation or when transmission by phase and amplitude modulation is switched to transmission by phase modulation, wherein the phase detection circuit includes a digital phase detection circuit and an analog phase detection circuit, and establishment of the phase control loop is performed first by using the digital phase detection circuit and next by using the analog phase detection circuit, and wherein when transmission only by the phase modulation is activated, after establishment of the phase control loop and before establishment of the amplitude control loop including the amplitude detection circuit, by using precharge means provided on a forward path in the amplitude control loop from the amplitude detection circuit to the power amplifier, the forward path is precharged up to a predetermined level faster than when an output of the amplitude detection circuit is used, and after precharge of the forward path by the precharge means, the digital phase detection circuit is switched to the analog phase detection circuit.

5. A method of ramping up an output level of a power amplifier of a radio communication system having a transmission oscillator, a phase detection circuit for comparing a phase of a reference signal with a chase of a feedback signal to control the transmission oscillator in accordance with a detected phase difference, said power amplifier which amplifies an oscillation signal generated by the transmission oscillator, and an amplitude detection circuit for comparing an amplitude of a reference signal with an amplitude of a feedback signal to control the power amplifier in accordance with a detected amplitude difference, wherein the radio communication system transmits, by phase modulation, a transmission signal by using a phase control loop including the phase detection circuit, and transmits, by phase and amplitude modulation, a transmission signal by using the phase control loop and an amplitude control loon including the amplitude detection circuit, said method of ramping up an output level of a power amplifier comprising steps of:

performing activation of the transmission oscillator, establishment of the phase control loop including the phase detection circuit, establishment of the amplitude control loop including the amplitude detection circuit, and ramp-up of the output level of the power amplifier, in this order recited, for activation of transmission related circuits; and lowering the output level of the power amplifier to a predetermined level higher than a level when the transmission related circuits are activated, while the transmission oscillator is maintained to operate, and thereafter ramping again the output level of the power amplifier without activation of the transmission oscillator, establishment of the phase control loop and establishment of the amplitude control loop, when transmission by phase modulation is switched to transmission by phase and amplitude modulation or when transmission by phase, and amplitude modulation is switched to transmission by phase modulation, wherein the phase detection circuit includes a digital phase detection circuit and an analog phase detection circuit and establishment of the phase control loop is performed first by using the digital phase detection circuit and next by using the analog phase detection circuit, and wherein when transmission by the phase and amplitude modulation is activated, after establishment of the phase control loop, the digital phase detection circuit is switched to the analog phase detection circuit, and before establishment of the amplitude control loop including the amplitude detection circuit, by using precharge means provided on a forward path in the amplitude control loop from the amplitude detection circuit to the power amplifier, the forward path is precharged up to a predetermined level faster than when an output of the amplitude detection circuit is used, and after precharge by the precharge means, the forward path of the amplitude control loop is validated.

* * * * *